US012796533B2

United States Patent
(12) United States Patent
Ting et al.

(10) Patent No.: US 12,796,533 B2
(45) Date of Patent: Nov. 10, 2026

(54) DIE STRUCTURES AND METHODS OF FORMING THE SAME

(71) Applicant: Taiwan Semiconductor Manufacturing Co., Ltd., Hsinchu (TW)

(72) Inventors: Kuo-Chiang Ting, Hsinchu (TW); Sung-Feng Yeh, Taipei City (TW); Ta Hao Sung, Hsinchu (TW); Ken-Yu Chang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 365 days.

(21) Appl. No.: 18/404,431

(22) Filed: Jan. 4, 2024

(65) Prior Publication Data

US 2025/0087555 A1 Mar. 13, 2025

Related U.S. Application Data

(60) Provisional application No. 63/581,805, filed on Sep. 11, 2023.

(51) Int. Cl.
*H10W 74/43* (2026.01)
*H10W 72/90* (2026.01)
(Continued)

(52) U.S. Cl.
CPC ......... *H10W 74/43* (2026.01); *H10W 74/121* (2026.01); *H10W 74/141* (2026.01);
(Continued)

(58) Field of Classification Search
CPC . H10W 40/70; H10W 74/121; H10W 74/141; H10W 74/43; H10W 74/147;
(Continued)

(56) References Cited

U.S. PATENT DOCUMENTS 8,993,380 B2 3/2015 Hou et al.
9,281,254 B2 3/2016 Yu et al.
(Continued)

FOREIGN PATENT DOCUMENTS

TW 202010071 A 3/2020
TW I698925 B 7/2020
(Continued)

*Primary Examiner* — David A Zarneke
(74) *Attorney, Agent, or Firm* — Slater Matsil, LLP

(57) ABSTRACT

In an embodiment, a device includes: a lower integrated circuit die; an upper integrated circuit die bonded to the lower integrated circuit die with a dielectric-to-dielectric bonding region and with a metal-to-metal bonding region; a first buffer layer around the upper integrated circuit die, the first buffer layer including a buffer material having a first thermal conductivity, the buffer material having a columnar crystalline structure, the columnar crystalline structure including crystalline columns having a substantially uniform orientation in a direction that extends away from the lower integrated circuit die; and a gap-fill dielectric over the first buffer layer and around the upper integrated circuit die, the gap-fill dielectric having a second thermal conductivity, the first thermal conductivity greater than the second thermal conductivity.

20 Claims, 20 Drawing Sheets

(51) Int. Cl.
*H10W 74/10* (2026.01)
*H10W 80/00* (2026.01)
*H10W 90/10* (2026.01)

(52) U.S. Cl.
CPC .......... *H10W 74/147* (2026.01); *H10W 72/90* (2026.01); *H10W 80/312* (2026.01); *H10W 80/327* (2026.01); *H10W 90/10* (2026.01)

(58) Field of Classification Search
CPC .. H10W 74/131; H10W 74/142; H10W 90/10
See application file for complete search history.

(56) References Cited

U.S. PATENT DOCUMENTS

| | | | |
|---|---|---|---|
| 9,299,649 | B2 | 3/2016 | Chiu et al. |
| 9,372,206 | B2 | 6/2016 | Wu et al. |
| 9,425,126 | B2 | 8/2016 | Kuo et al. |
| 9,443,783 | B2 | 9/2016 | Lin et al. |
| 9,461,018 | B1 | 10/2016 | Tsai et al. |
| 9,496,189 | B2 | 11/2016 | Yu et al. |
| 9,666,502 | B2 | 5/2017 | Chen et al. |
| 9,735,131 | B2 | 8/2017 | Su et al. |
| 10,204,893 | B2 | 2/2019 | Uzoh et al. |
| 11,011,447 | B2 | 5/2021 | Wang et al. |
| 11,562,983 | B2 | 1/2023 | Chen et al. |
| 11,948,926 | B2 | 4/2024 | Yu et al. |
| 2023/0058497 | A1 | 2/2023 | Suk et al. |
| 2023/0207414 | A1 | 6/2023 | Cho et al. |

FOREIGN PATENT DOCUMENTS

| | | | |
|---|---|---|---|
| TW | 202101685 | A | 1/2021 |
| TW | I756866 | B | 3/2022 |
| TW | 202310302 | A | 3/2023 |

DIE STRUCTURES AND METHODS OF FORMING THE SAME

PRIORITY CLAIM AND CROSS-REFERENCE

This application claims the benefit of U.S. Provisional Application No. 63/581,805, filed on Sep. 11, 2023, which application is hereby incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
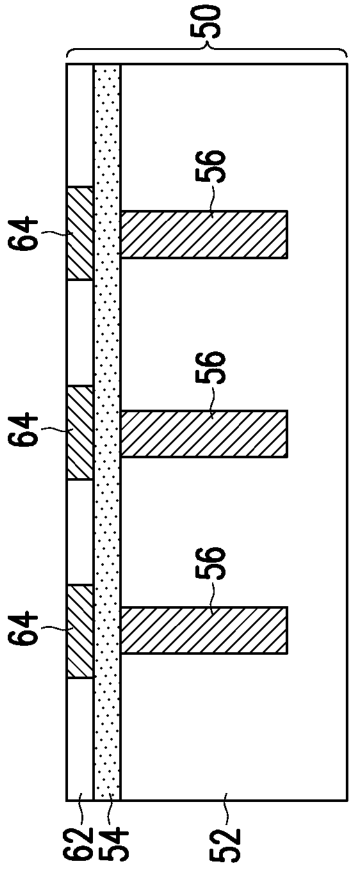
FIG. 1 is a cross-sectional view of an integrated circuit die.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to various embodiments, a die structure includes buffer layers for gap-fill dielectrics. The buffer layers are formed of a material having a columnar crystalline structure, which may increase the thermal conductivity of the buffer layers. The thermal pathway for conducting heat out of the die structure may thus be improved. Optionally, the die structure may include a heat dissipation layer that is formed of a material having a large thermal conductivity and high compressibility. The heat dissipation layer may help reduce warpage of the die structure. Reducing the warpage of the die structure may improve the yield and/or performance of an integrated circuit package in which the die structure is subsequently packaged.

FIG. 1 is a cross-sectional view of an integrated circuit die 50. The integrated circuit die 50 will be bonded to other dies in subsequent processing to form a die structure. The integrated circuit die 50 may be a logic die (e.g., central processing unit (CPU), graphics processing unit (GPU), system-on-a-chip (SoC) die, application processor (AP), microcontroller, etc.), a memory die (e.g., dynamic random access memory (DRAM) die, static random access memory (SRAM) die, etc.), a bridge die (e.g., a local silicon interconnect (LSI) die), a power management die (e.g., power management integrated circuit (PMIC) die), a radio frequency (RF) die, an interface die, a sensor die, a micro-electro-mechanical-system (MEMS) die, a signal processing die (e.g., digital signal processing (DSP) die), a front-end die (e.g., analog front-end (AFE) dies), the like, or combinations thereof.

The integrated circuit die 50 may be formed in a wafer, which may include different device regions that are singulated to form a plurality of integrated circuit dies. The integrated circuit die 50 may be processed according to applicable manufacturing processes to form integrated circuits. For example, the integrated circuit die 50 may include a semiconductor substrate 52, which may be a substrate of silicon, doped or undoped, or an active layer of a semiconductor-on-insulator (SOI) substrate. The semiconductor substrate 52 may include other semiconductor materials, such as germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. Other substrates, such as multi-layered or gradient substrates, may also be used. The semiconductor substrate 52 has an active surface (e.g., the surface facing upward in FIG. 1) and an inactive surface (e.g., the surface facing downward in FIG. 1). Devices (not separately illustrated) may be formed in and/or on the active surface of the semiconductor substrate 52. The devices may be active devices (e.g., transistors, diodes, etc.) and/or passive devices (e.g., capacitors, inductors, resistors, etc.). The inactive surface may be free from devices.

An interconnect structure 54 is disposed over the active surface of the semiconductor substrate 52, and electrically connects the devices of the semiconductor substrate 52 to form an integrated circuit. The interconnect structure 54 may include one or more dielectric layer(s) and respective metallization layer(s) in the dielectric layer(s). The dielectric layer(s) may be, e.g., low-k dielectric layer(s). The metallization layer(s) may include conductive vias and/or conductive lines to interconnect the devices of the semiconductor substrate 52. The metallization layer(s) may be formed of a conductive material, such as a metal, such as copper, cobalt, aluminum, gold, combinations thereof, or the like. The metallization layer(s) of the interconnect structure 54 may be formed by a damascene process, such as a single damascene process, a dual damascene process, or the like.

Optionally, conductive vias 56 extend into the interconnect structure 54 and/or the semiconductor substrate 52. The conductive vias 56 are electrically coupled to the metallization layer(s) of the interconnect structure 54. As an example to form the conductive vias 56, recesses can be formed in the interconnect structure 54 and/or the semiconductor substrate 52 by, for example, etching, milling, laser techniques, a combination thereof, or the like. A thin barrier layer may be conformally deposited in the recesses, such as by chemical vapor deposition (CVD), atomic layer deposition (ALD), physical vapor deposition (PVD), thermal oxidation, a combination thereof, or the like. The barrier layer may be formed of an oxide, a nitride, combinations thereof, or the like. A conductive material may be formed over the barrier layer and in the recesses. The conductive material may be formed by an electro-chemical plating process, CVD, ALD, PVD, a combination thereof, or the like. Examples of conductive materials include copper, tungsten, aluminum, silver, gold, a combination thereof, or the like. Excess conductive material and barrier layer is removed from a surface of the interconnect structure 54 or the semiconductor substrate 52 by, for example, a chemical-mechanical polish (CMP). The remaining portions of the barrier layer and conductive material in the recesses form the conductive vias 56. After their initial formation, the conductive vias 56 may be buried in the semiconductor substrate 52. The semiconductor substrate 52 may be thinned in subsequent processing to expose the conductive vias 56 at the inactive surface of the semiconductor substrate 52. After the exposure process, the conductive vias 56 are through-substrate vias (TSVs), such as through-silicon vias, that extend through the semiconductor substrate 52.

A dielectric layer 62 is over the interconnect structure 54, at the front-side of the integrated circuit die 50. The dielectric layer 62 may be formed of an oxide such as silicon oxide, phosphosilicate glass (PSG), borosilicate glass (BSG), boron-doped phosphosilicate glass (BPSG), a tetraethyl orthosilicate (TEOS) based oxide, or the like; a nitride such as silicon nitride or the like; a polymer such as polybenzoxazole (PBO), polyimide, a benzocyclobutene (BCB) based polymer, or the like; a combination thereof; or the like. The dielectric layer 62 may be formed, for example, by CVD, spin coating, lamination, or the like. Optionally, one or more passivation layer(s) (not separately illustrated) are disposed between the dielectric layer 62 and the interconnect structure 54.

Die connectors 64 extend through the dielectric layer 62. The die connectors 64 may include conductive pillars, pads, or the like, to which external connections can be made. In some embodiments, the die connectors 64 include bond pads at the front-side of the integrated circuit die 50, and include bond pad vias that connect the bond pads to an upper metallization layer of the interconnect structure 54. The die connectors 64 (including the bond pads and the bond pad vias) may be formed by a damascene process, such as a single damascene process, a dual damascene process, or the like. The die connectors 64 may be formed of a suitable conductive material, such as copper, tungsten, aluminum, silver, gold, a combination thereof, or the like, which can be formed by, for example, plating or the like.

Optionally, chip probe (CP) testing may be performed on the integrated circuit die 50. For example, a chip probe may be attached to test pads (not separately illustrated). The CP testing may be performed on the integrated circuit die 50 to ascertain whether the integrated circuit die 50 is a known good die (KGD). Thus, only integrated circuit dies 50, which are KGDs, undergo subsequent processing and are packaged, while dies which fail the chip probe testing are not packaged.

FIGS. 2-12 are cross-sectional views of intermediate stages in the manufacturing of a die structure 100 (see FIG. 12), in accordance with some embodiments. The die structure 100 is a stack of integrated circuit dies 50 (including first integrated circuit dies 50A and second integrated circuit dies 50B). The die structure 100 is formed by bonding the integrated circuit dies 50 together in a device region 102D. The device region 102D will be singulated to form the die structure 100. Processing of one device region 102D is illustrated, but it should be appreciated that any number of device regions 102D can be simultaneously processed to form any number of the die structures 100.

A die structure 100 (see FIG. 12) is a component that may be subsequently packaged to form an integrated circuit package. The integrated circuit dies of the die structure 100 may be heterogeneous dies. Packaging the die structure 100 in lieu of packaging the dies individually may allow heterogeneous dies to be integrated with a small footprint. The die structure 100 may be a system-on-integrated-chips (SoIC) device, although other types of devices may be formed.

Figure 2:
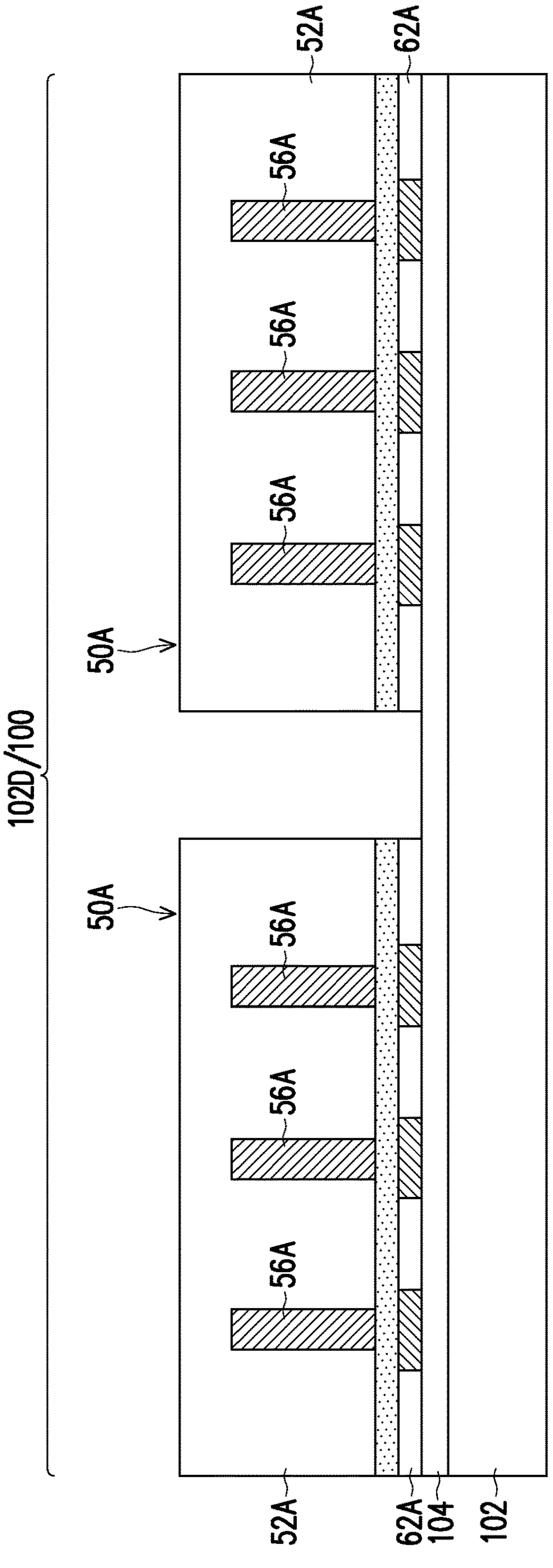
FIGS. 2-12 are cross-sectional views of intermediate stages in the manufacturing of a die structure, in accordance with some embodiments.

In FIG. 2, first integrated circuit dies 50A are attached to a carrier substrate 102 in a face-down manner, such that the front sides of the first integrated circuit dies 50A are attached to the carrier substrate 102. The dielectric layers 62A of the first integrated circuit dies 50A are attached to the carrier substrate 102. The first integrated circuit dies 50A may be placed by, e.g., a pick-and-place process. In the illustrated embodiment, two first integrated circuit dies 50A are placed in the device region 102D, although any desired quantity of first integrated circuit dies 50A may be placed in the device region 102D. The first integrated circuit dies 50A may be logic devices, such as CPUs, GPUs, SoCs, microcontroller, or the like.

The carrier substrate 102 may be a glass carrier substrate, a ceramic carrier substrate, or the like. The carrier substrate 102 may be a wafer, such that multiple die structures can be formed on the carrier substrate 102 simultaneously.

The first integrated circuit dies 50A may be attached to the carrier substrate 102 by bonding the first integrated circuit dies 50A to the carrier substrate 102 with a bonding layer 104. The bonding layer 104 is on front sides of the first integrated circuit dies 50A and on a surface of the carrier substrate 102. In some embodiments, the bonding layer 104 includes an oxide layer such as a layer of silicon oxide. In some embodiments, the bonding layer 104 includes an adhesive, such as a suitable epoxy, a die attach film (DAF), or the like. The bonding layer 104 may include any desired quantity of oxide layers, adhesive films, etc. The bonding layer 104 may be applied to front sides of the first integrated circuit dies 50A, may be applied over the surface of the carrier substrate 102, and/or the like. For example, the bonding layer 104 may be applied to the front sides of the first integrated circuit dies 50A before singulating to separate the first integrated circuit dies 50A.

Figure 3:
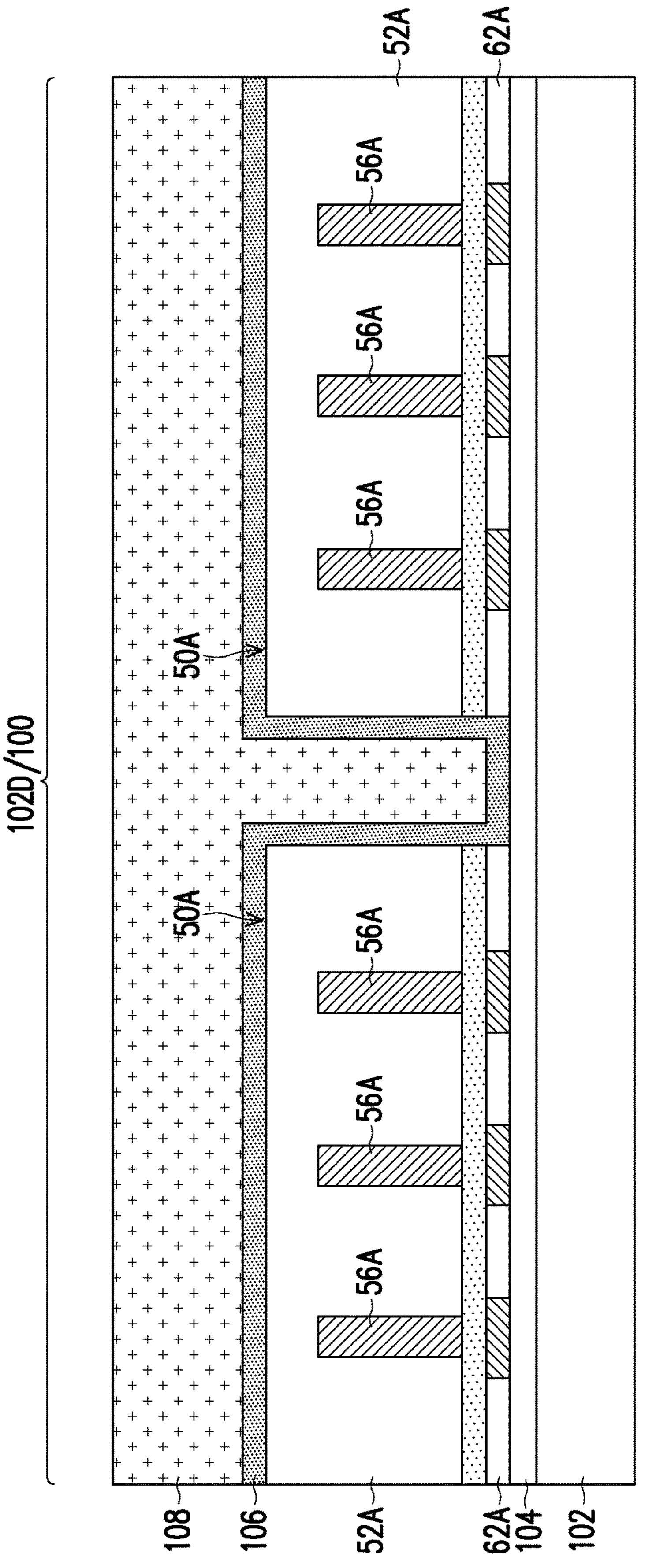

In FIG. 3, a buffer layer 106 is deposited on the first integrated circuit dies 50A. The buffer layer 106 is a liner layer, on which an overlying gap-fill dielectric will be formed. The buffer layer 106 may protect the first integrated circuit dies 50A from damage when subsequently forming the gap-fill dielectric. Additionally, the buffer layer 106 is formed of a buffer material that has a large thermal conductivity. Thus, the buffer layer 106 protects the first integrated circuit dies 50A and forms a thermal pathway to conduct heat from the first integrated circuit dies 50A.

The buffer layer 106 is formed of a buffer material that has a large thermal conductivity. In some embodiments, the buffer material of the buffer layer 106 has a thermal conductivity in the range of 2 W/mK to 150 W/mK. Acceptable buffer materials include silicon nitride, silicon oxynitride, silicon carbide, silicon carbonitride, silicon oxycarbide, aluminum nitride, gallium nitride, zinc oxide, combinations thereof, and the like. The buffer material may be formed by a sputtering process such as a physical vapor deposition (PVD); a chemical deposition process such as chemical vapor deposition (CVD), atomic layer deposition (ALD), or the like; a spray coating process; or the like. The buffer material of the buffer layer 106 may have a polycrystalline structure. The buffer material of the buffer layer 106 has heterogenous micro-structure, which may help the buffer material have a large thermal conductivity. Specifically, the buffer material has a columnar crystalline structure. The columnar crystalline structure includes crystalline columns having a substantially uniform orientation in a same direction, such as a direction that extends away from the carrier substrate 102. The crystalline columns form a thermal pathway; thus, the buffer layer 106 has an increased thermal conductivity along the direction in which the crystalline columns extend, as compared to other directions along which the crystalline columns do not extend. Additionally, the columnar crystalline structure helps subsequently formed overlying materials have a better crystalline structure, and affords good protection to the first integrated circuit dies 50A. The buffer material may be formed with a columnar crystalline structure by depositing the buffer material with a sputtering process, such as PVD.

A gap-fill dielectric 108 is form on the buffer layer 106. The gap-fill dielectric 108 and the buffer layer 106 are around and between the first integrated circuit dies 50A in the device region 102D. Initially, the gap-fill dielectric 108 and the buffer layer 106 may bury or cover the first integrated circuit dies 50A, such that the top surfaces of the gap-fill dielectric 108 and the buffer layer 106 are above the top surfaces of the first integrated circuit dies 50A.

The gap-fill dielectric 108 is formed of a dielectric material that has a low k-value (or relative permittivity), thus providing good electrical insulation. The k-value of the gap-fill dielectric 108 may be greater than the k-value of the buffer layer 106. The gap-fill dielectric 108 may have a thermal conductivity of at least 5 W/mK. In some embodiments, the gap-fill dielectric 108 has a thermal conductivity in the range of 5 W/mK to 300 W/mK. Acceptable gap-fill dielectric materials include silicon nitride, silicon oxynitride, silicon carbide, silicon carbonitride, silicon oxycarbide, aluminum nitride, zinc oxide, boron nitride, beryllium oxide, combinations thereof, and the like. Other gap-fill materials, such as gallium nitride, could be utilized. The material(s) of the gap-fill dielectric 108 may have a greater thermal conductivity than other dielectric materials, such as silicon oxide. The thermal conductivity of the buffer layer 106 is greater than the thermal conductivity of the gap-fill dielectric 108. The gap-fill dielectric 108 may be formed by a sputtering process such as a physical vapor deposition (PVD); a chemical deposition process such as chemical vapor deposition (CVD), atomic layer deposition (ALD), or the like; a spray coating process; or the like. The gap-fill dielectric 108 may have a polycrystalline structure. The gap-fill dielectric 108 has a different micro-structure than the buffer material of the buffer layer 106. Specifically, the gap-fill dielectric 108 has a non-columnar crystalline structure. The non-columnar crystalline structure includes crystalline grains having a varied orientation (also called a non-uniform orientation or a random orientation) that are not arranged in columns. The gap-fill dielectric 108 may be formed with a non-columnar crystalline structure by depositing the gap-fill dielectric 108 with a spray coating process or with a chemical deposition process, such as chemical vapor deposition (CVD), atomic layer deposition (ALD), or the like.

Figure 4:
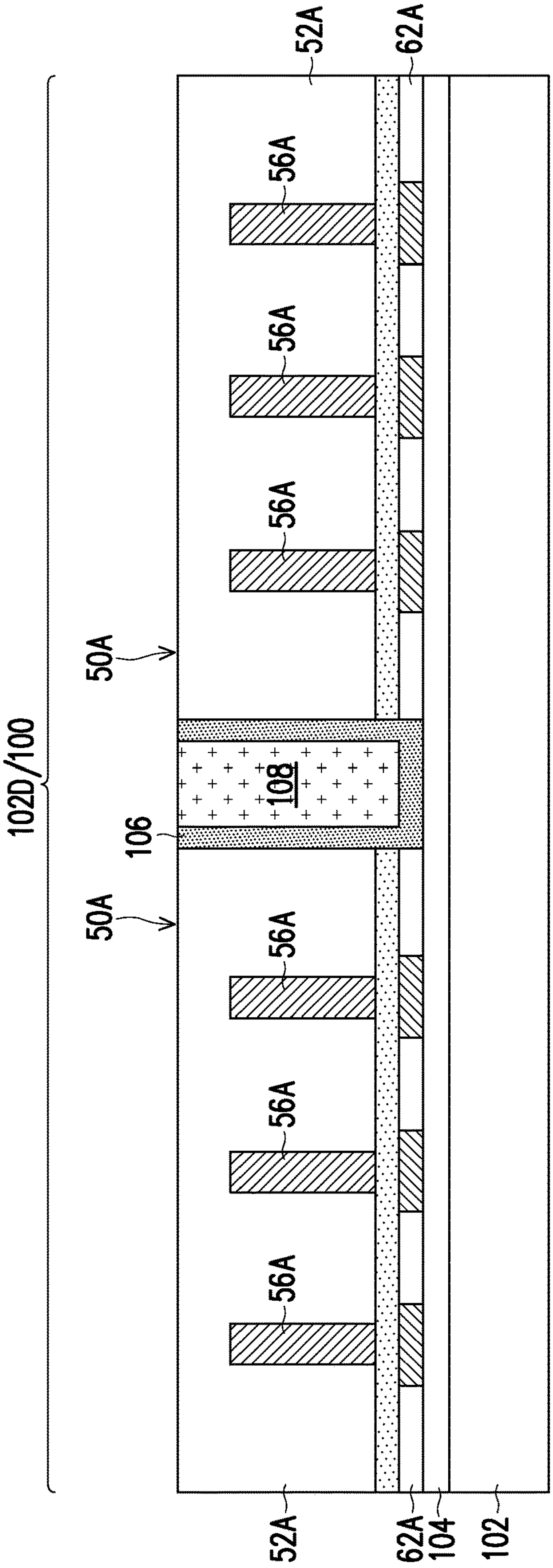

In FIG. 4, a removal process is performed to level the top surfaces of the gap-fill dielectric 108 and the buffer layer 106 with the inactive surfaces of the first integrated circuit dies 50A. In some embodiments, a planarization process such as a chemical mechanical polish (CMP), an etch-back process, combinations thereof, or the like is utilized. After the planarization process, surfaces of the gap-fill dielectric 108, the buffer layer 106, and the first integrated circuit dies 50A (including the semiconductor substrates 52A) are substantially coplanar (within process variations). The conductive vias 56A of the first integrated circuit dies 50A may remain buried by the semiconductor substrates 52A after this removal process.

Figure 5:
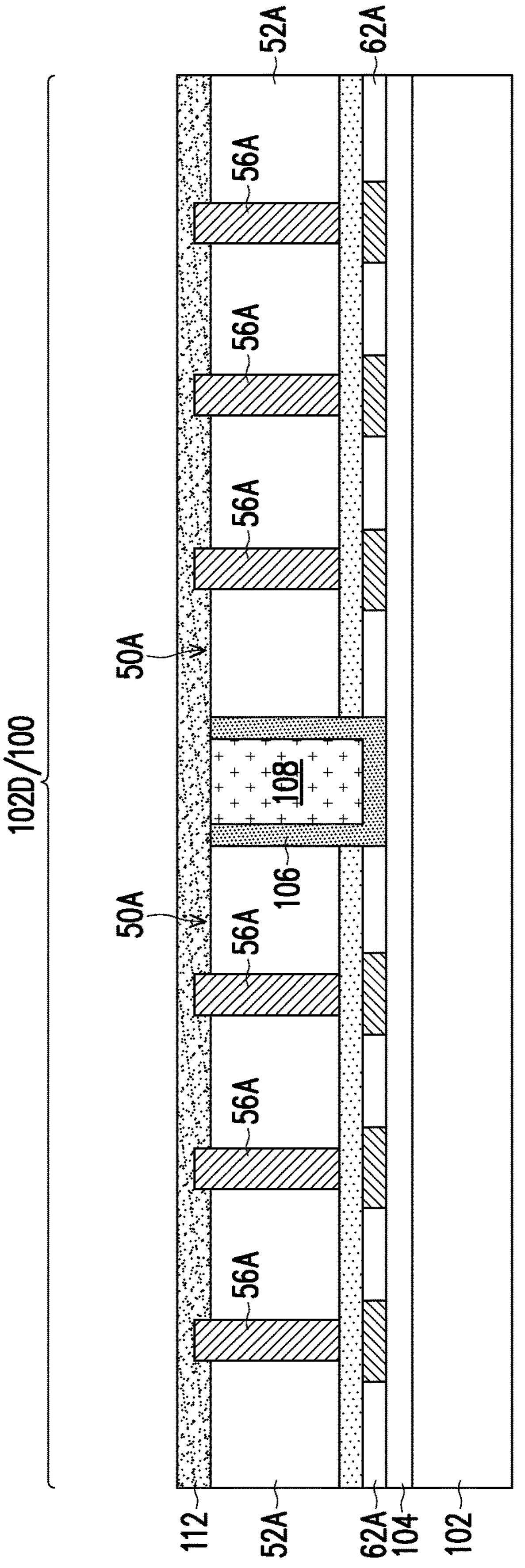

In FIG. 5, the semiconductor substrates 52A are thinned to expose the conductive vias 56A. Portions of the gap-fill dielectric 108 and the buffer layer 106 may also be removed by the thinning process. The thinning process may be, for example, a grinding process, a chemical-mechanical polish (CMP), an etch-back process, a combination thereof, or the like, which is performed at the back sides of the first integrated circuit dies 50A. The semiconductor substrates 52A are then recessed to expose portions of the sidewalls of the conductive vias 56A. The recessing may be by an etching process, such as a dry etch, a wet etch, or combinations thereof. After the recessing, the conductive vias 56A protrude from the inactive surfaces of the semiconductor substrates 52A.

A bonding layer 112 is then formed on the gap-fill dielectric 108, the buffer layer 106, and the back sides of the first integrated circuit dies 50A. The bonding layer 112 is around portions of the sidewalls of the conductive vias 56A of the first integrated circuit dies 50A. The bonding layer 112 may bury or cover the conductive vias 56A, such that the top surface of the bonding layer 112 is above the surfaces of the conductive vias 56A and the semiconductor substrates 52A. The bonding layer 112 will be utilized in a subsequent bonding process, and may help electrically isolate the conductive vias 56A from one another, thus avoiding shorting. The bonding layer 112 is formed of a dielectric material. The dielectric material can be an oxide such as silicon oxide, phosphosilicate glass (PSG), borosilicate glass (BSG), boron-doped phosphosilicate glass (BPSG), a tetraethyl orthosilicate (TEOS) based oxide, or the like, which may be formed by a suitable deposition process such as chemical vapor deposition (CVD), atomic layer deposition (ALD), or the like.

Figure 6:
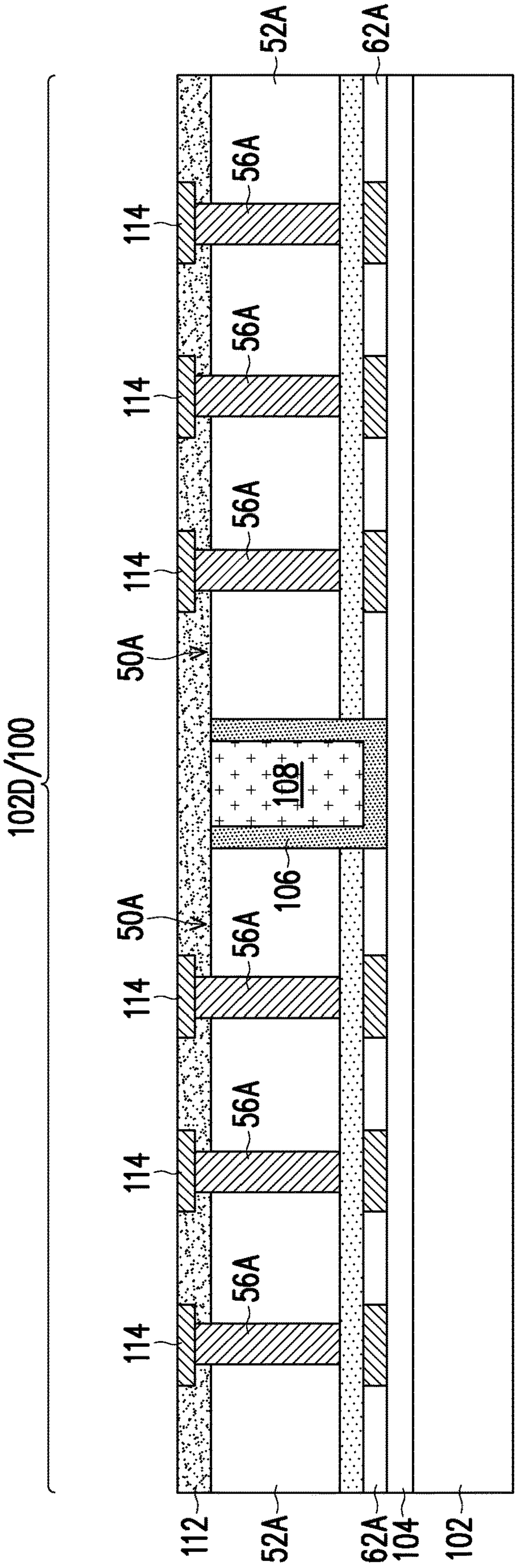

In FIG. 6, die connectors 114 are formed in the bonding layer 112. The die connectors 114 are connected to the conductive vias 56A. The die connectors 114 may be formed by a damascene process, such as a single damascene process, a dual damascene process, or the like. The die connectors 114 can be formed of a conductive material, such as a metal, such as copper, aluminum, or the like, which can be formed by, for example, plating, or the like. In some embodiments, a planarization process such as a chemical mechanical polish (CMP), an etch-back process, combinations thereof, or the like is performed on the die connectors 114, and the bonding layer 112. After the planarization process, surfaces of the die connectors 114 and the bonding layer 112 are substantially coplanar (within process variations).

Figure 7:
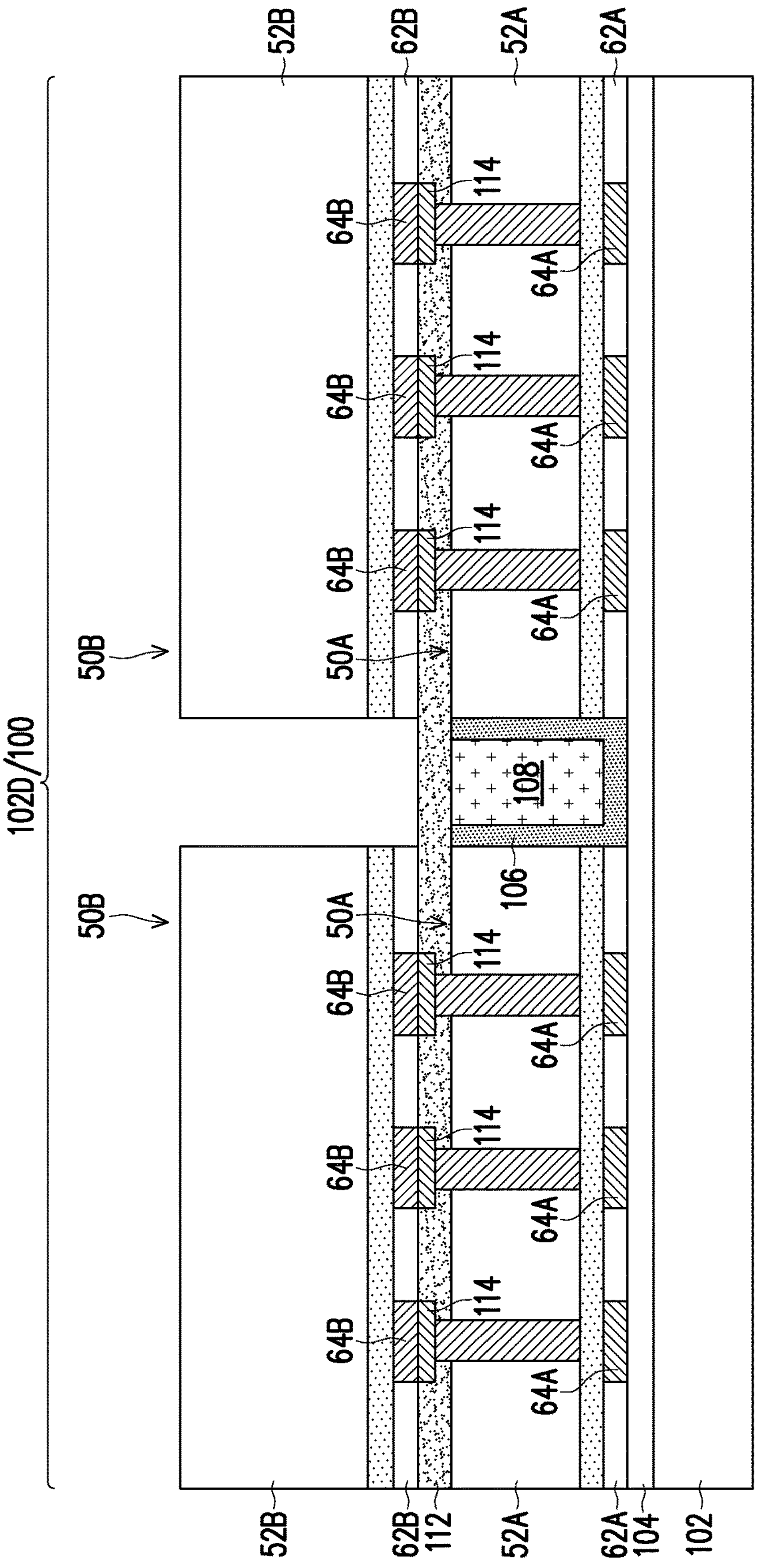

In FIG. 7, second integrated circuit dies 50B are attached to the first integrated circuit dies 50A via the bonding layer 112 and the die connectors 114, such that the front-sides of the second integrated circuit dies 50B face the back-sides of the first integrated circuit dies 50A. In the illustrated embodiment, one second integrated circuit die 50B is attached above each first integrated circuit die 50A, although any desired quantity of second integrated circuit dies 50B may be attached above each first integrated circuit die 50A. The second integrated circuit dies 50B may be memory devices, such as dynamic random access memory (DRAM) dies, static random access memory (SRAM) dies, hybrid memory cube (HMC) modules, high bandwidth memory (HBM) modules, or the like. The second integrated circuit dies 50B may be logic devices, such as CPUs, GPUs, SoCs, microcontroller, or the like.

The second integrated circuit dies 50B may be attached to the bonding layer 112 and the die connectors 114 by placing the second integrated circuit dies 50B on the bonding layer 112 and the die connectors 114, then bonding the second integrated circuit dies 50B to the first integrated circuit dies 50A via the bonding layer 112 and the die connectors 114. The second integrated circuit dies 50B may be placed by, e.g., a pick-and-place process. As an example of the bonding process, the second integrated circuit dies 50B may be bonded to the bonding layer 112 and the die connectors 114 by hybrid bonding. The dielectric layers 62B of the second integrated circuit dies 50B are directly bonded to the bonding layer 112 through dielectric-to-dielectric bonding, without using any adhesive material (e.g., die attach film). The die connectors 64B of the second integrated circuit dies 50B are directly bonded to the die connectors 114 through metal-to-metal bonding, without using any eutectic material (e.g., solder). The bonding may include a pre-bonding and an annealing. During the pre-bonding, a small pressing force is applied to press the second integrated circuit dies 50B against the bonding layer 112. The pre-bonding is performed at a low temperature, such as about room temperature, and after the pre-bonding, the dielectric layers 62B are bonded to the bonding layer 112. The bonding strength is then improved in a subsequent annealing step, in which the bonding layer 112, the die connectors 114, the dielectric layers 62B, and the die connectors 64B are annealed. Thus, dielectric-to-dielectric bonds such as fusion bonds are formed, bonding the bonding layer 112 to the dielectric layers 62B. For example, the bonds can be covalent bonds between the material of the bonding layer 112 and the material of the dielectric layers 62B. The die connectors 114 may be connected to the die connectors 64B with a one-to-one correspondence. The die connectors 114 and the die connectors 64B may be in physical contact after the pre-bonding, or may expand to be brought into physical contact during the annealing. Further, during the annealing, the material of the die connectors 114 and the die connectors 64B (e.g., copper) intermingles, so that metal-to-metal bonds are also formed. Hence, the resulting bonds include both dielectric-to-dielectric bonding regions and metal-to-metal bonding regions.

In this embodiment, the second integrated circuit dies 50B do not include conductive vias 56 (previously described for FIG. 1). The die structure 100 will include two layers of integrated circuit dies 50, and the conductive vias 56 are excluded from the second integrated circuit dies 50B because the second integrated circuit dies 50B are the upper layer of integrated circuit dies 50 in the die structure 100. In other embodiments, the die structure 100 includes more than two layers of integrated circuit dies 50, such as three layers of integrated circuit dies 50, and the conductive vias 56 may be formed in other layers of integrated circuit dies 50 besides the upper layer of integrated circuit dies 50.

Figure 8:
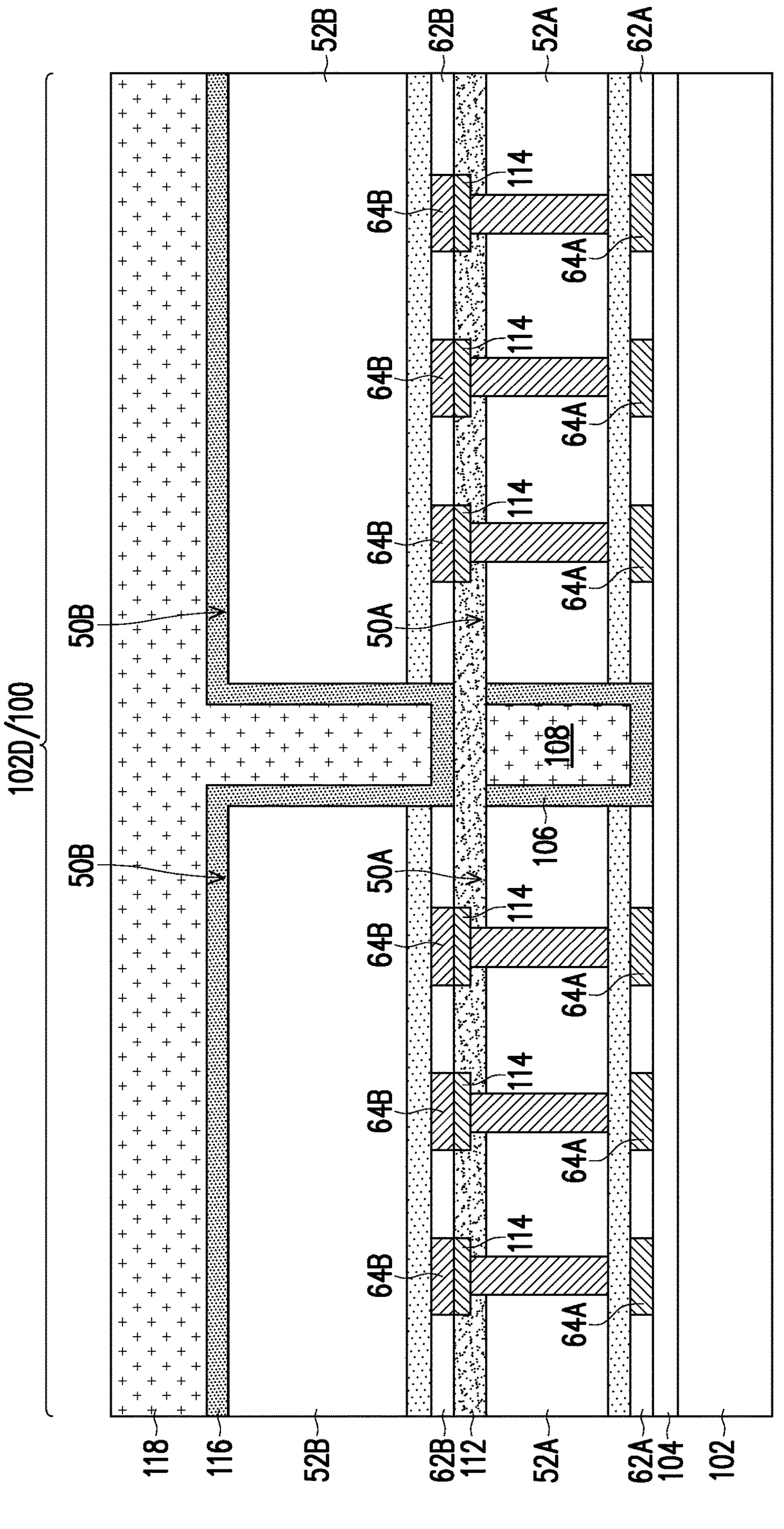

In FIG. 8, a buffer layer 116 is deposited on the second integrated circuit dies 50B. The buffer layer 116 is a liner layer, on which an overlying gap-fill dielectric will be formed. The buffer layer 116 may protect the second integrated circuit dies 50B from damage when subsequently forming the gap-fill dielectric. Additionally, the buffer layer 116 is formed of a buffer material that has a large thermal conductivity. Thus, the buffer layer 116 protects the second integrated circuit dies 50B and forms a thermal pathway to conduct heat from the second integrated circuit dies 50B.

The buffer layer 116 may be formed from one of the candidate materials of the buffer layer 106, which may be formed by one of the candidate methods of forming the buffer layer 106. The buffer layer 116 may be formed of the same material as the buffer layer 106, or may include a different material than the buffer layer 106. The material of the buffer layer 116 has a columnar crystalline structure. The columnar crystalline structure includes crystalline columns having a substantially uniform orientation in a same direction, such as a direction that extends away from the carrier substrate 102. The crystalline columns form a thermal pathway; thus, the buffer layer 116 has an increased thermal conductivity along the direction in which the crystalline columns extend, as compared to other directions along which the crystalline columns do not extend.

A gap-fill dielectric 118 is form on the buffer layer 116. The gap-fill dielectric 118 and the buffer layer 116 are around and between the second integrated circuit dies 50B in the device region 102D. Initially, the gap-fill dielectric 118 and the buffer layer 116 may bury or cover the second integrated circuit dies 50B, such that the top surfaces of the gap-fill dielectric 118 and the buffer layer 116 are above the top surfaces of the second integrated circuit dies 50B. The gap-fill dielectric 118 has a different micro-structure than the buffer material of the buffer layer 116.

The gap-fill dielectric 118 may be formed from one of the candidate materials of the gap-fill dielectric 108, which may be formed by one of the candidate methods of forming the gap-fill dielectric 108. The gap-fill dielectric 118 may be formed of the same material as the gap-fill dielectric 108, or may include a different material than the gap-fill dielectric 108. The thermal conductivity of the material of the buffer layer 116 is greater than the thermal conductivity of the gap-fill dielectric 118.

Figure 9:
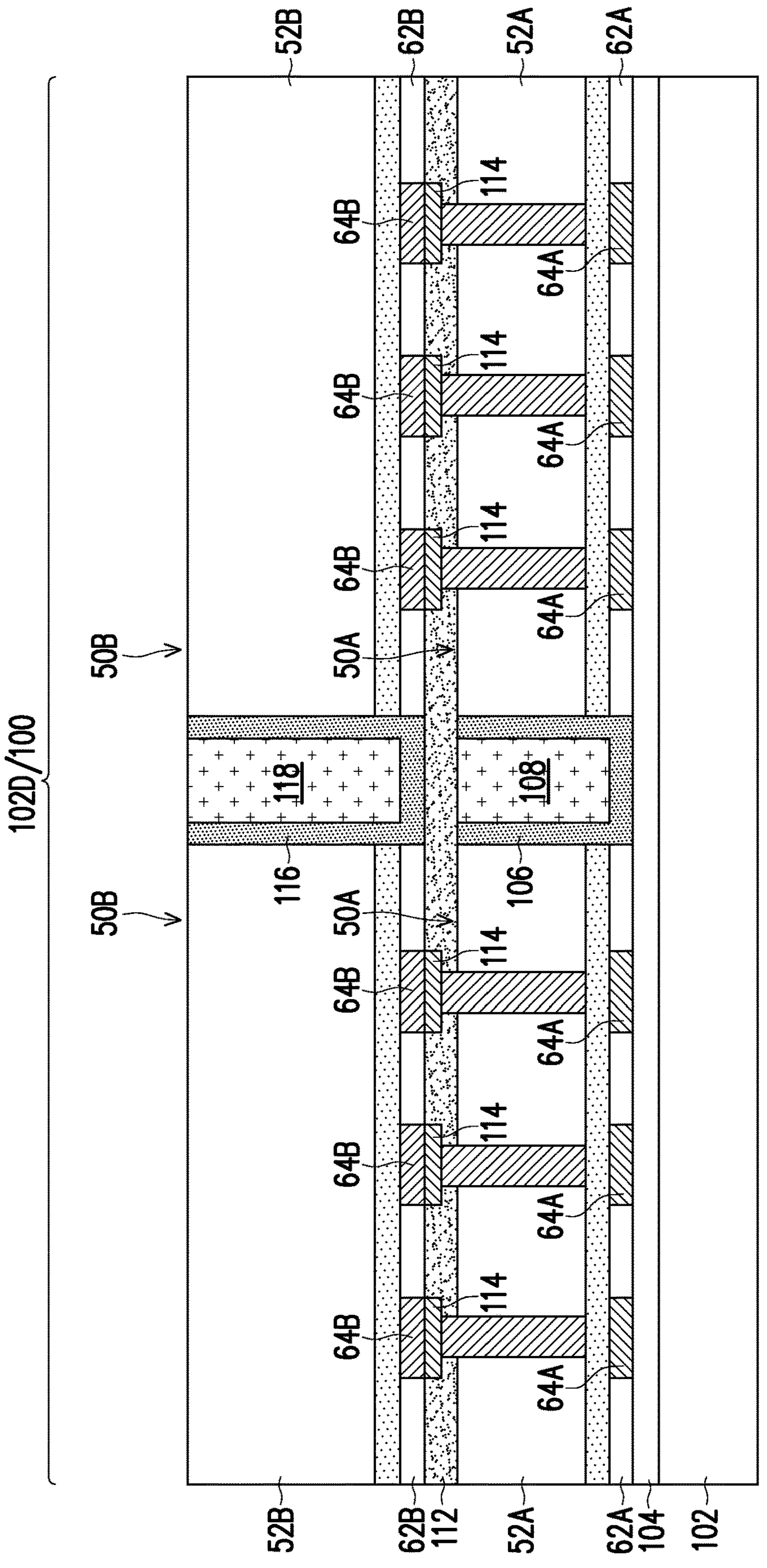

In FIG. 9, a removal process is performed to level the top surfaces of the gap-fill dielectric 118 and the buffer layer 116 with the inactive surfaces of the second integrated circuit dies 50B. In some embodiments, a planarization process such as a chemical mechanical polish (CMP), an etch-back process, combinations thereof, or the like is utilized. After the planarization process, surfaces of the gap-fill dielectric 118, the buffer layer 116, and the second integrated circuit dies 50B (including the semiconductor substrates 52B) are substantially coplanar (within process variations).

Figure 10:
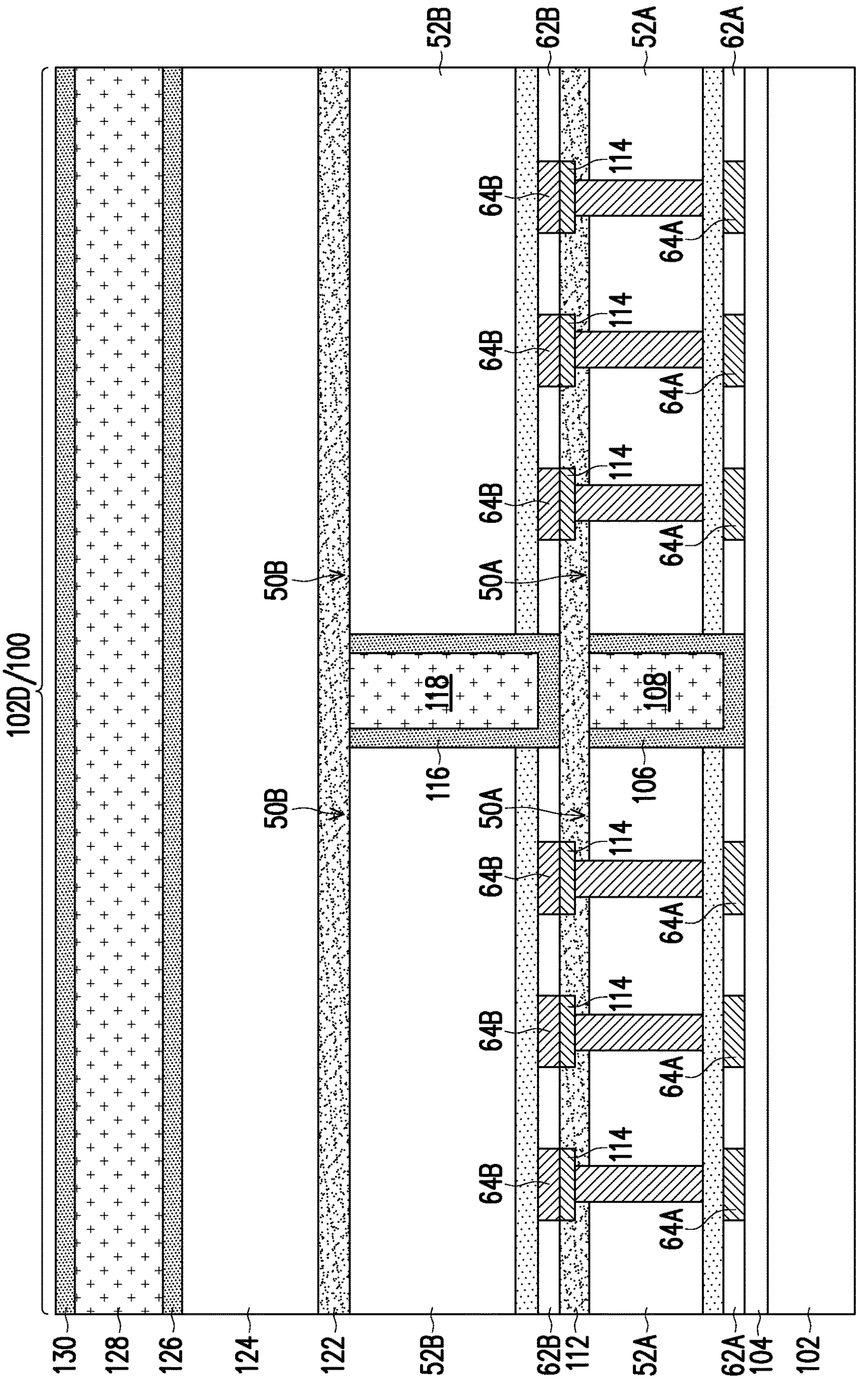

In FIG. 10, a support substrate 124 is attached to the gap-fill dielectric 118, the buffer layer 116, and the second integrated circuit dies 50B. The support substrate may be a glass support substrate, a ceramic support substrate, a semiconductor substrate (e.g., a silicon substrate), a wafer (e.g., a silicon wafer), or the like. The support substrate 124 may provide structural support during subsequent processing steps and in the completed device. The support substrate 124 may be substantially free of any active or passive devices.

The support substrate 124 may be attached to the gap-fill dielectric 118, the buffer layer 116, and the second integrated circuit dies 50B by bonding the support substrate 124 to the gap-fill dielectric 118, the buffer layer 116, and the second integrated circuit dies 50B with a bonding layer 122. The bonding layer 122 is on surfaces of the support substrate 124, the gap-fill dielectric 118, the buffer layer 116, and the second integrated circuit dies 50B. The bonding layer 122 may be formed from one of the candidate materials of the bonding layer 104, which may be formed by one of the candidate methods of forming the bonding layer 104. The bonding layer 122 may be formed of the same material as the bonding layer 104, or may include a different material than the bonding layer 104.

A buffer layer 126 is deposited on the support substrate 124. In this embodiment, the buffer layer 126 physically contacts the support substrate 124. The buffer layer 126 is a liner layer, on which an overlying heat dissipation layer will be formed. The buffer layer 126 is formed of a buffer material that has a large thermal conductivity. Thus, the buffer layer 126 forms a thermal pathway to conduct heat from the support substrate 124.

The buffer layer 126 may be formed from one of the candidate materials of the buffer layer 106, which may be formed by one of the candidate methods of forming the buffer layer 106. The buffer layer 126 may be formed of the same material as the buffer layer 106, or may include a different material than the buffer layer 106. The material of the buffer layer 126 has a columnar crystalline structure.

A heat dissipation layer 128 is formed on the buffer layer 126. The heat dissipation layer 128 is a warpage control layer. The heat dissipation layer 128 is formed of a heat dissipation material that is highly compressive and has a large thermal conductivity. The heat dissipation layer 128 may exert a compressive strain on the support substrate 124. When the first integrated circuit dies 50A and the second integrated circuit dies 50B are both logic devices, they may be large, which may increase the risk of the die structure 100 warping. Specifically, the second integrated circuit dies 50B may exert a compressive strain on the support substrate 124. The heat dissipation layer 128 and the integrated circuit dies 50B exert their respective compressive strains against opposing sides of the support substrate 124. The compressive strain exerted on the support substrate 124 by the heat dissipation layer 128 is in opposite direction from (and thus counteracts) the compressive strain exerted on the support substrate 124 by the second integrated circuit dies 50B, thereby reducing the warpage of the die structure 100. Reducing the warpage of the die structure 100 may decrease the risk of cold solder joints being formed and/or increase the flatness of a top surface for mating to a heatsink. Thus, the yield and/or performance of an integrated circuit package in which the die structure 100 is subsequently packaged may be improved.

The heat dissipation layer 128 is formed of a heat dissipation material that has a large stiffness. In some embodiments, the heat dissipation material of the heat dissipation layer 128 has a stiffness in the range of 150 GPa to 500 GPa, such as about 300 GPa. The heat dissipation layer 128 is formed of a heat dissipation material that has a large thermal conductivity, such as a thermal conductivity of at least 50 W/mK, such as a thermal conductivity of at least 150 W/mK. In some embodiments, the heat dissipation material of the heat dissipation layer 128 has a thermal conductivity in the range of 150 W/mK to 300 W/mK. Acceptable heat dissipation materials include silicon nitride, silicon oxynitride, silicon carbide, silicon carbonitride, silicon oxycarbide, aluminum nitride, gallium nitride, zinc oxide, combinations thereof, and the like. The heat dissipation material may be formed by a sputtering process such as a physical vapor deposition (PVD); a chemical deposition process such as chemical vapor deposition (CVD), atomic layer deposition (ALD), or the like; a spray coating process; or the like. The heat dissipation material may be a non-conductive material, such as a porous dielectric material or a semiconductor material. The thermal conductivity of the heat dissipation layer 128 is greater than the thermal conductivity of the buffer layers 106, 116, 126. The heat dissipation material of the heat dissipation layer 128 may have a polycrystalline structure. The heat dissipation material of the heat dissipation layer 128 has a different micro-structure than the buffer material of the buffer layers 106, 116, 126. Specifically, the heat dissipation material has a non-columnar crystalline structure. The non-columnar crystalline structure includes crystalline grains having a varied orientation (also called a non-uniform orientation or a random orientation). The heat dissipation material may be formed with a non-columnar crystalline structure by depositing the heat dissipation material with a spray coating process or with a chemical deposition process, such as chemical vapor deposition (CVD), atomic layer deposition (ALD), or the like.

The buffer layers 106, 116, 126; the gap-fill dielectrics 108, 118; and the heat dissipation layer 128 may be formed of the same material. For example, they may each be formed of aluminum nitride. The buffer material of the buffer layers 106, 116, 126 may have a first crystalline structure (e.g., a columnar crystalline structure), while the gap-fill dielectrics 108, 118 and the heat dissipation material of the heat dissipation layer 128 may each have a second crystalline structure (e.g., a non-columnar crystalline structure) that is different than the first crystalline structure. Additionally, the method of forming the buffer layers 106, 116, 126 may be different than the method(s) of forming the gap-fill dielectrics 108, 118 and the heat dissipation layer 128. The buffer layers 106, 116, 126 may be formed by a sputtering process, while the gap-fill dielectrics 108, 118 and the heat dissipation layer 128 may each be formed by a spray coating process or a chemical deposition process. In some embodiments, the buffer material of the buffer layers 106, 116, 126 is formed of aluminum nitride having a columnar crystalline structure by PVD, while the gap-fill dielectrics 108, 118 and the heat dissipation material of the heat dissipation layer 128 are formed of aluminum nitride having a non-columnar crystalline structure by a spray coating process.

Optionally, a protection layer 130 may be formed on the heat dissipation layer 128. The protection layer 130 protects the underlying features. The protection layer 130 is formed of a protection material that has a large hardness. The hardness of the protection material may be greater than the hardness of the first integrated circuit dies 50A and the second integrated circuit dies 50B. In some embodiments, the protection material of the protection layer 130 has a hardness in the range of 5 GPa to 50 GPa, such as at least 8 GPa. The protection material may have a thermal conductivity of at least 100 W/mK. In some embodiments, the protection material of the protection layer 130 has a thermal conductivity in the range of 2 W/mK to 150 W/mK. Acceptable protection materials include silicon nitride, silicon oxynitride, silicon carbide, silicon carbonitride, silicon oxycarbide, aluminum nitride, gallium nitride, zinc oxide, combinations thereof, and the like. The protection material may be formed by a sputtering process such as a physical vapor deposition (PVD); a chemical deposition process such as chemical vapor deposition (CVD), atomic layer deposition (ALD), or the like; a spray coating process; or the like.

Figure 11:
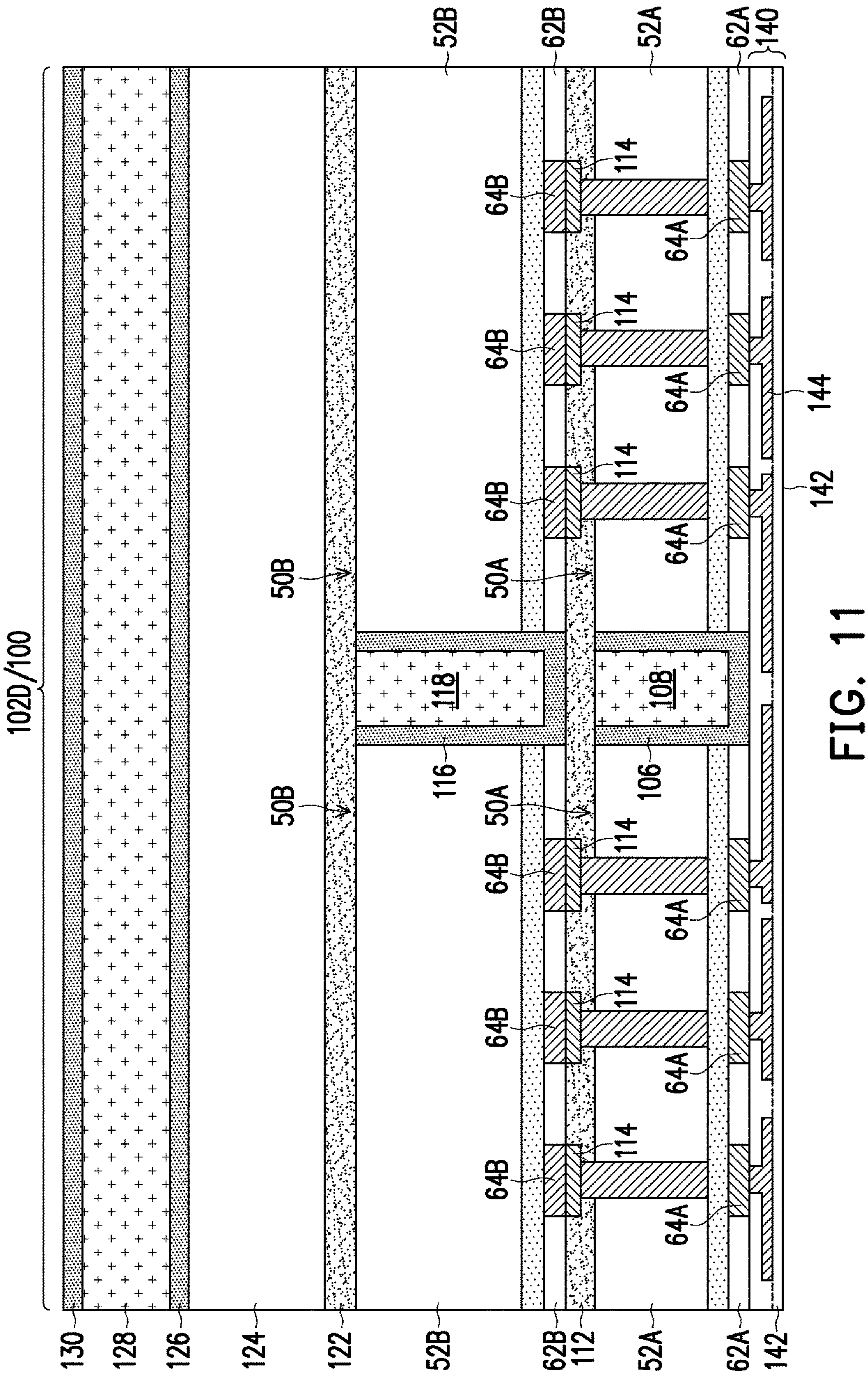

In FIG. 11, a carrier substrate de-bonding is performed to detach (or "de-bond") the carrier substrate 102 from the first integrated circuit dies 50A. The buffer layer 106 and the front sides of the first integrated circuit dies 50A may thus be exposed. In some embodiments where the bonding layer 104 includes an oxide layer, the de-bonding includes applying a removal process, such as a grinding process, to the carrier substrate 102 and the bonding layer 104. The structure is then flipped over and placed on a tape (not separately illustrated).

A redistribution structure 140 is then formed on the active surfaces of the first integrated circuit dies 50A and on the bottom surface of the buffer layer 106. The redistribution structure 140 includes dielectric layers 142 and metallization layers 144 (sometimes referred to as redistribution layers or redistribution lines) among the dielectric layers 142. For example, the redistribution structure 140 may include a plurality of metallization layers 144 separated from each other by respective dielectric layers 142. The metallization layers 144 of the redistribution structure 140 may be electrically coupled to the die connectors 64A of the first integrated circuit dies 50A.

In some embodiments, the dielectric layers 142 are formed of a polymer, which may be a photo-sensitive material such as PBO, polyimide, a BCB-based polymer, or the like. In other embodiments, the dielectric layers 142 are formed of a nitride such as silicon nitride; an oxide such as silicon oxide, PSG, BSG, BPSG; or the like. The dielectric layers 142 may be formed by spin coating, lamination, CVD, the like, or a combination thereof. After each dielectric layer 142 is formed, it is then patterned to form openings exposing underlying conductive features, such as portions of the underlying die connectors 64A or metallization layers 144. The patterning may be by an acceptable process, such as by exposing the dielectrics layers to light when the dielectric layers 142 are a photo-sensitive material, or by etching using, for example, an anisotropic etch. If the dielectric layers 142 are photo-sensitive materials, the dielectric layers 142 can be developed after the exposure.

The metallization layers 144 include conductive vias and conductive lines. The conductive vias extend through respective dielectric layers 142, and the conductive lines extend along respective dielectric layers 142. As an example to form a metallization layer 144, a seed layer (not separately illustrated) is formed over the respective underlying conductive features (e.g., portions of the underlying die connectors 64A or metallization layers 144). For example, the seed layer can be formed on a respective dielectric layer 142 and in the openings through the respective dielectric layer 142. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using a deposition process, such as PVD or the like. A photoresist is then formed and patterned on the seed layer. The photoresist may be formed by spin coating or the like and may be exposed to light for patterning. The pattern of the photoresist corresponds to the metallization layer. The patterning forms openings through the photoresist to expose the seed layer. A conductive material is formed in the openings of the photoresist and on the exposed portions of the seed layer. The conductive material may be formed by plating, such as electroless plating or electroplating from the seed layer, or the like. The conductive material may comprise a metal or a metal alloy, such as copper, titanium, tungsten, aluminum, the like, or combinations thereof. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form a metallization layer 144 for the redistribution structure 140.

The redistribution structure 140 is illustrated as an example. More or fewer dielectric layers 142 and metallization layers 144 than illustrated may be formed in the redistribution structure 140 by performing the previously described steps a desired quantity of times.

Figure 12:
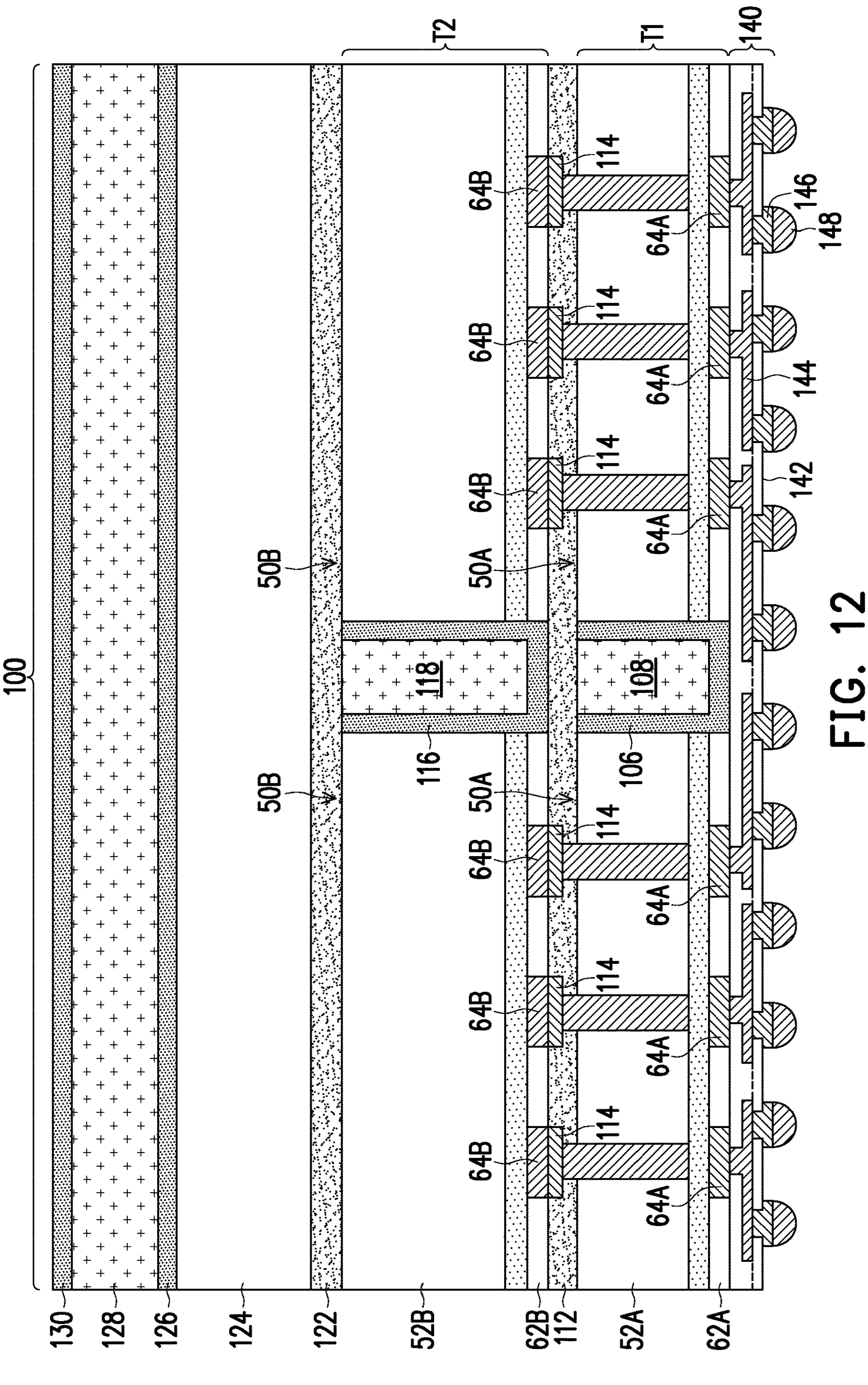

In FIG. 12, a singulation process is performed along scribe line regions, e.g., between the device region 102D and adjacent device regions (not separately illustrated). The singulation process may include a sawing process, a laser cutting process, or the like. The singulation process singulates the device region 102D from the adjacent device regions. The resulting, singulated die structure 100 is from the device region 102D. The die structure 100 includes multiple tiers of integrated circuit dies 50. In the illustrated embodiment, the die structure 100 includes a first tier T1 of first integrated circuit dies 50A and a second tier T2 of second integrated circuit dies 50B, although any quantity of tiers of integrated circuit dies 50 may be included in the die structure 100.

Optionally, additional features may be formed for attaching the die structures 100 to package components. In some embodiments, under bump metallurgies (UBMs) 146 are formed for external connection to the redistribution structure 140. Further, conductive connectors 148 may be formed on the UBMs 146. The conductive connectors 148 may be used to connect the UBMs 146 to a package component such as an interposer, a package substrate, or the like.

The UBMs 146 may be formed through a lower dielectric layer 142 of the redistribution structure 140. The UBMs 146 have bump portions on and extending along the major surface of the lower dielectric layer 142, and have via portions extending through the lower dielectric layer 142 to physically and electrically couple the lower metallization layer 144 of the redistribution structure 140. As a result, the UBMs 146 are electrically coupled to the integrated circuit dies 50. The UBMs 146 may be formed of the same material(s) as the metallization layer(s) 144. In some embodiments, the UBMs 146 have a different size than the metallization layer(s) 144.

The conductive connectors 148 may be formed on the UBMs 146. The conductive connectors 148 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 148 may include a conductive material such as solder, copper, aluminum, gold, nickel, silver, palladium, tin, the like, or a combination thereof. In some embodiments, the conductive connectors 148 are formed by initially forming a layer of a reflowable material (e.g., solder) through evaporation, electroplating, printing, solder transfer, ball placement, or the like. Once a layer of solder has been formed on the structure, a reflow may be performed in order to shape the material into the desired bump shapes. In another embodiment, the conductive connectors 148 include metal pillars (such as copper pillars) formed by a sputtering, printing, electro plating, electroless plating, CVD, or the like. The metal pillars may be solder-free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof, which may be formed by a plating process.

Figure 13:
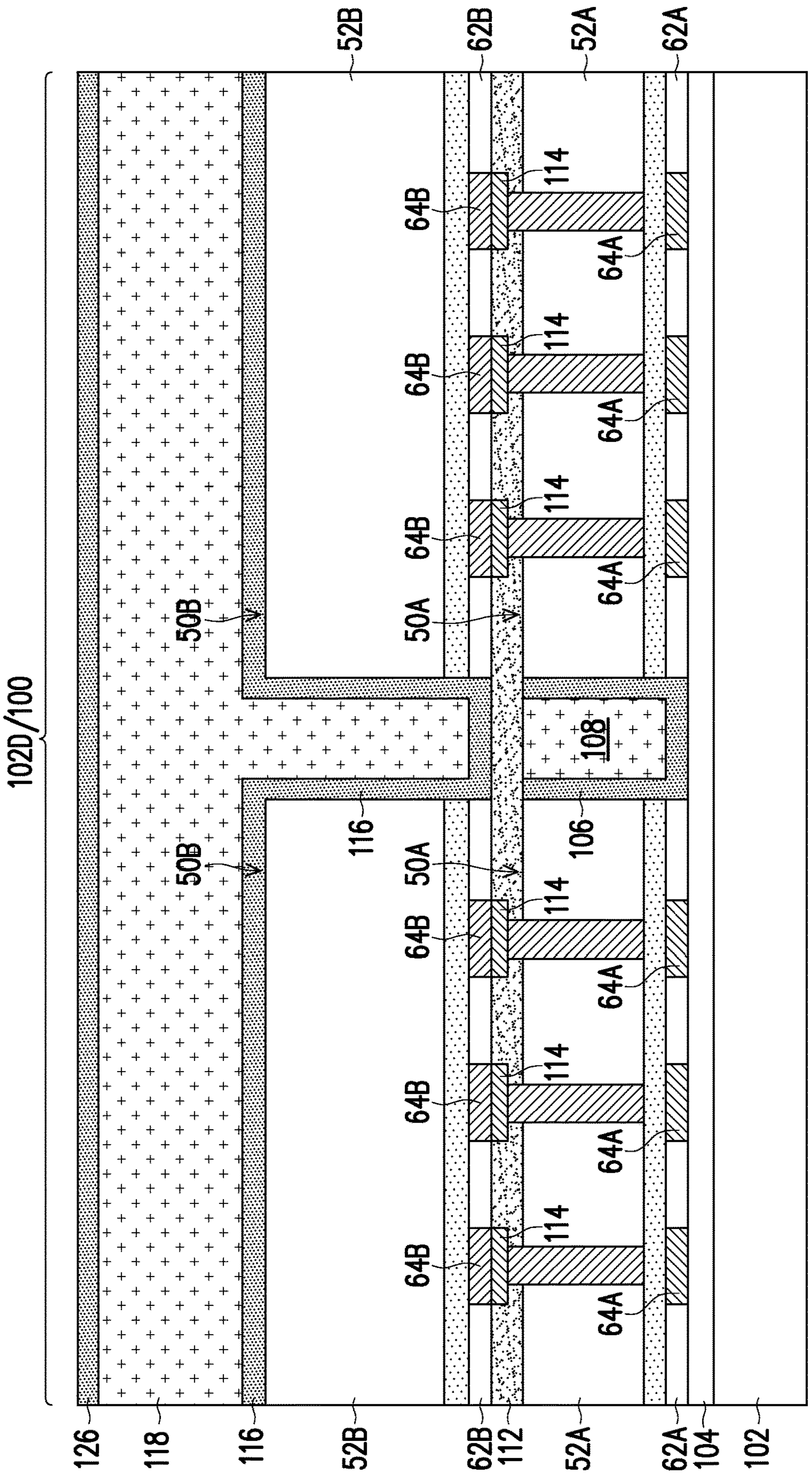
FIGS. 13-15 are cross-sectional views of intermediate stages in the manufacturing of a die structure, in accordance with some embodiments.
Figure 14:
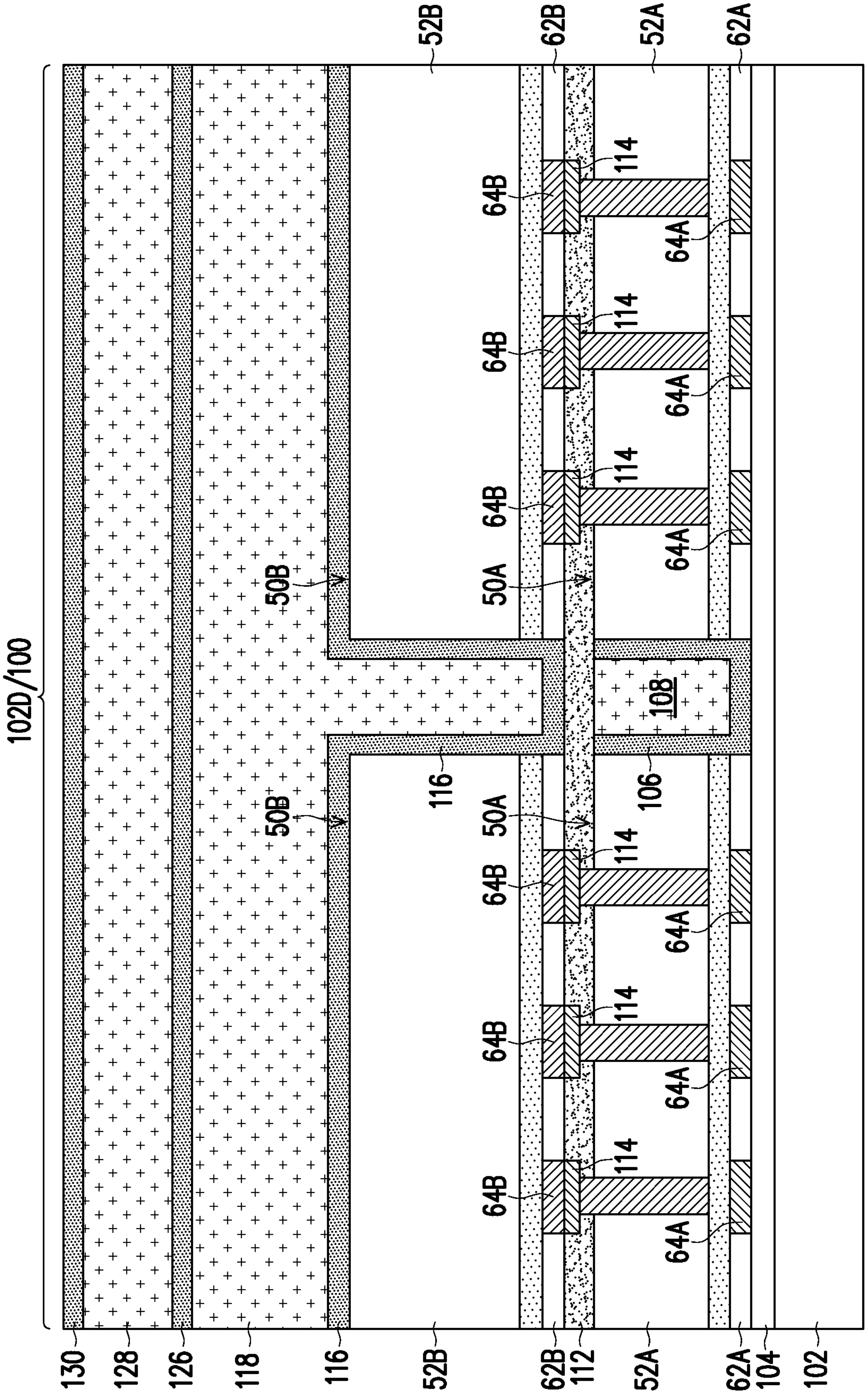
Figure 15:
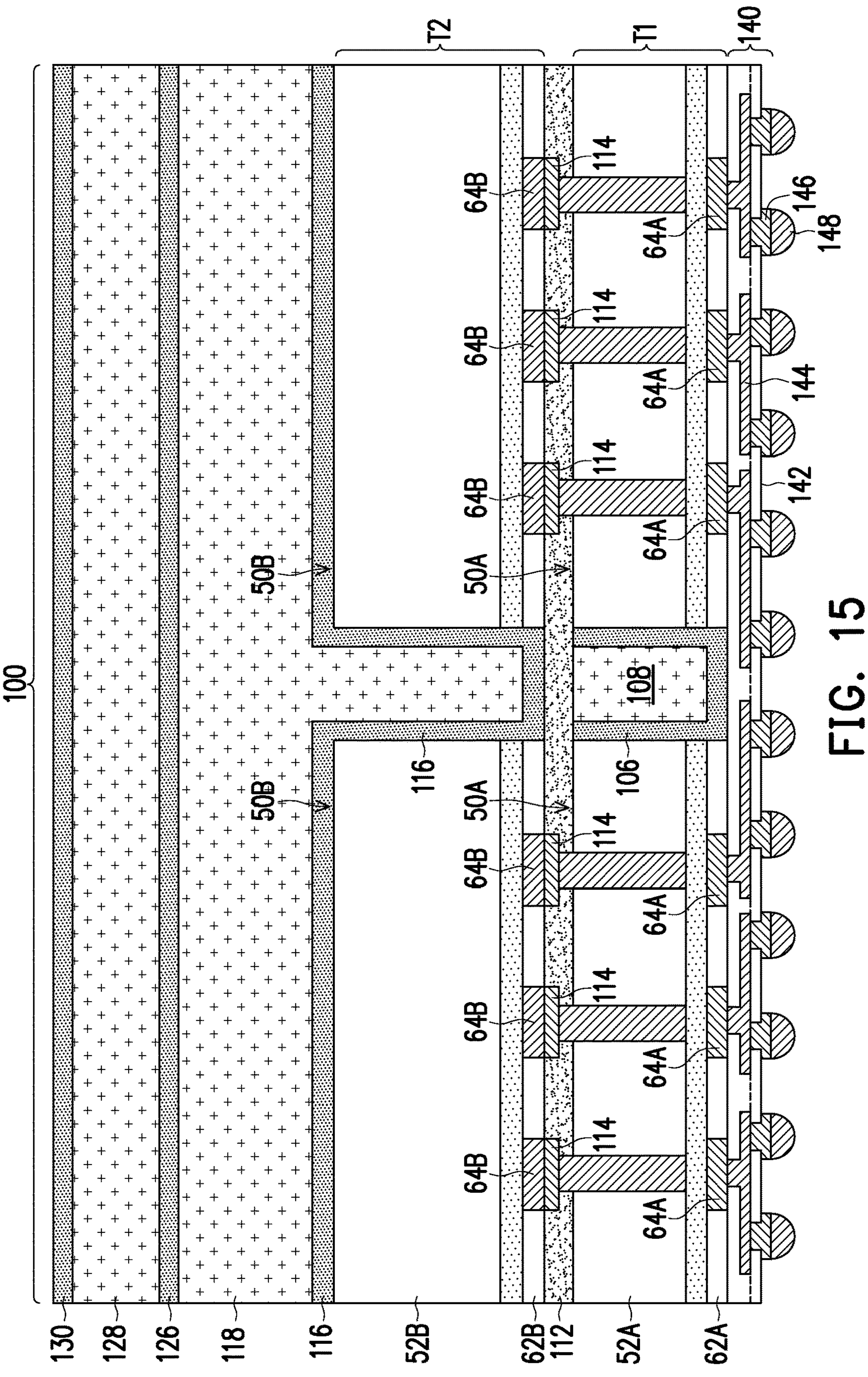

FIGS. 13-15 are cross-sectional views of intermediate stages in the manufacturing of a die structure 100, in accordance with some other embodiments. This embodiment is similar to the embodiment of FIGS. 2-12, except a removal process for the gap-fill dielectric 118 and the buffer layer 116 (previously described for FIG. 9) is omitted. Accordingly, the top surfaces of the gap-fill dielectric 118 and the buffer layer 116 are disposed over the inactive surfaces of the second integrated circuit dies 50B. Additionally, the support substrate 124 is omitted.

In FIG. 13, and proceeding from the step of FIG. 8, a buffer layer 126 is deposited on the gap-fill dielectric 118. In this embodiment, the buffer layer 126 physically contacts the gap-fill dielectric 118. The buffer layer 126 may be formed in a similar manner as previously described for FIG. 10.

In FIG. 14, a heat dissipation layer 128 is formed on the buffer layer 126. The heat dissipation layer 128 may be formed in a similar manner as previously described for FIG. 10. Optionally, a protection layer 130 may be formed on the heat dissipation layer 128. The protection layer 130 may be formed in a similar manner as previously described for FIG. 10.

In FIG. 15, appropriate steps as previously described are performed to complete the manufacturing of a die structure 100. Because the die structure 100 is carrier-free in this embodiment, it may be thinner than a die structure 100 that includes a support substrate 124.

FIGS. 16A-16D are cross-sectional views of portions of die structures 100, in accordance with various embodiments. These are simplified views of layouts of integrated circuit dies 50 for die structures 100. Some features of the die structures 100 are omitted for illustration clarity. In these embodiments, the die structures 100 may include a first tier of first integrated circuit dies 50A, a second tier of second integrated circuit dies 50B, and (optionally) a third tier of third integrated circuit dies 50C. The die structures 100 may be carrier-free or may include support substrates.

Figure 16A:
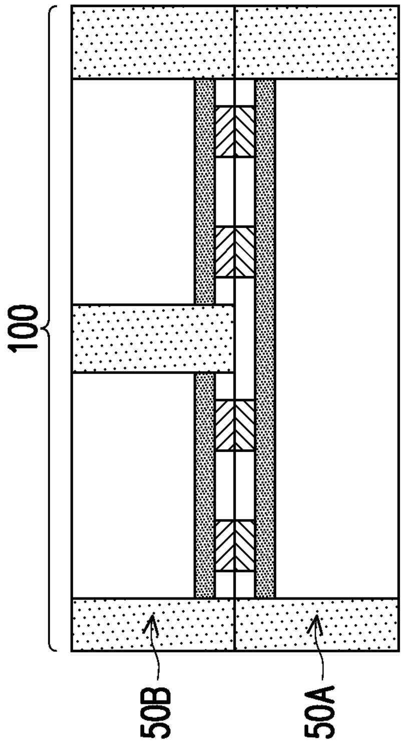
FIGS. 16A-16D are cross-sectional views of portions of die structures, in accordance with various embodiments.
Figure 16B:
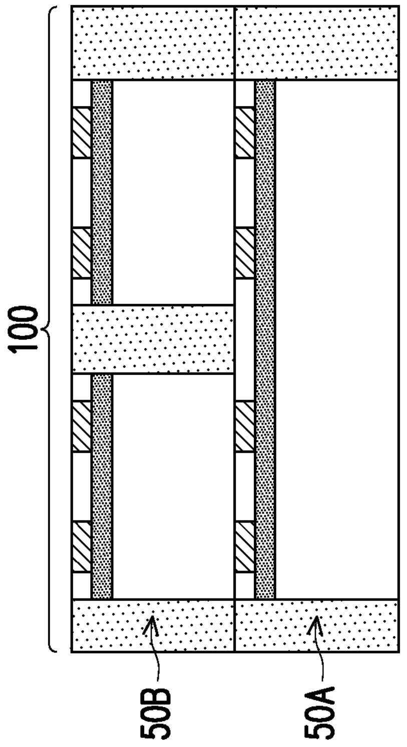
Figure 16C:
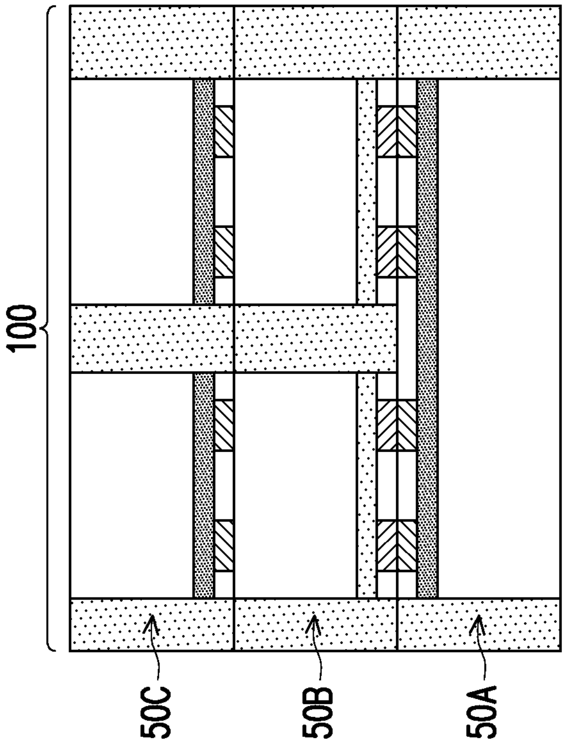
Figure 16D:
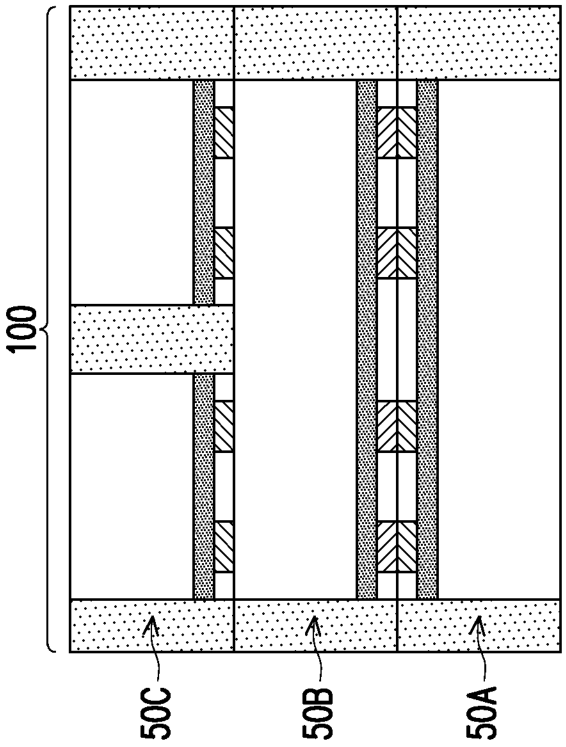

In some embodiments, as shown in FIG. 16A, a front-side of a single first integrated circuit die 50A is bonded to the front-sides of multiple second integrated circuit dies 50B. In some embodiments, as shown in FIG. 16B, a front-side of a single first integrated circuit die 50A is bonded to the back-sides of multiple second integrated circuit dies 50B. In some embodiments, as shown in FIG. 16C, a front-side of a single first integrated circuit die 50A is bonded to the front-sides of multiple second integrated circuit dies 50B, while the back-sides of the second integrated circuit dies 50B are bonded to the front-sides of respective third integrated circuit dies 50C. In some embodiments, as shown in FIG. 16D, a front-side of a single first integrated circuit die 50A is bonded to a front-side of a single second integrated circuit die 50B, while the back-side of the second integrated circuit die 50B is bonded to the front-sides of multiple third integrated circuit dies 50C.

In these embodiments, the outer sidewalls of the integrated circuit dies 50 in different tiers are aligned with each other. In other embodiments (not separately illustrated), the outer sidewalls of the integrated circuit dies 50 in different tiers are offset from each other. For example, the outer sidewalls of the second integrated circuit die(s) 50B may be located within an area of the first integrated circuit die 50A.

Figure 17:
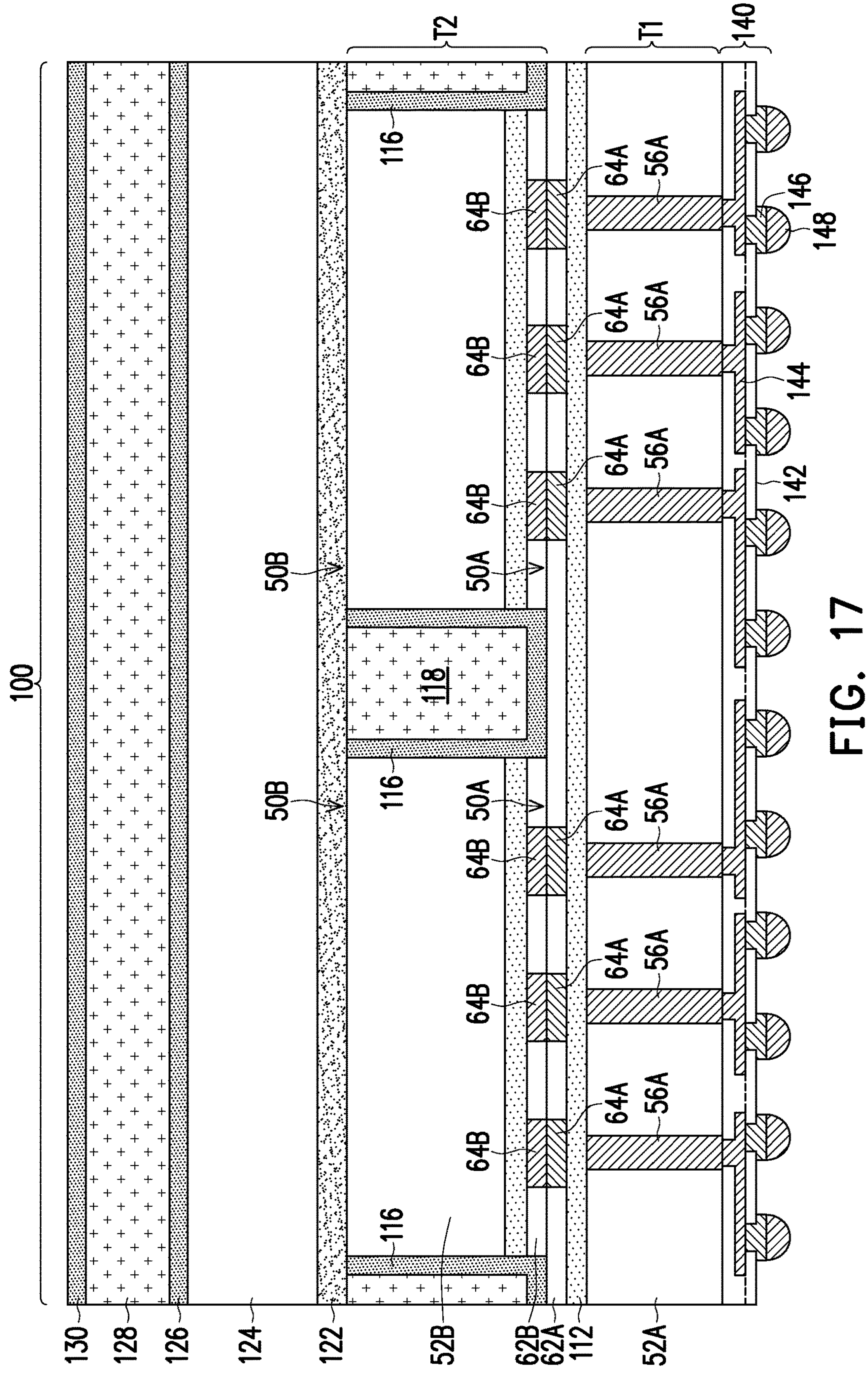
FIG. 17 is a cross-sectional view of a die structure, in accordance with some other embodiments.

FIG. 17 is a cross-sectional view of a die structure 100, in accordance with some other embodiments. This embodiment is similar to the embodiment of FIG. 12, except the die structure 100 only includes one first integrated circuit die 50A, and the first integrated circuit die 50A is laterally coterminous with the gap-fill dielectric 118. Additionally, the gap-fill dielectric 108 and the buffer layer 106 are omitted. Further, the front-sides of the second integrated circuit dies 50B face the front-side of the first integrated circuit die 50A. The redistribution structure 140 is formed on the inactive surface of the first integrated circuit die 50A. The metallization layers 144 are electrically coupled to the conductive vias 56A of the first integrated circuit die 50A.

The second integrated circuit dies 50B may be bonded to the first integrated circuit die 50A by hybrid bonding. The dielectric layers 62B of the second integrated circuit dies 50B are directly bonded to the dielectric layers 62A of the first integrated circuit die 50A through dielectric-to-dielectric bonding, without using any adhesive material (e.g., die attach film). The die connectors 64B of the second integrated circuit dies 50B are directly bonded to the die connectors 64A of the first integrated circuit die 50A through metal-to-metal bonding, without using any eutectic material (e.g., solder).

Figure 18:
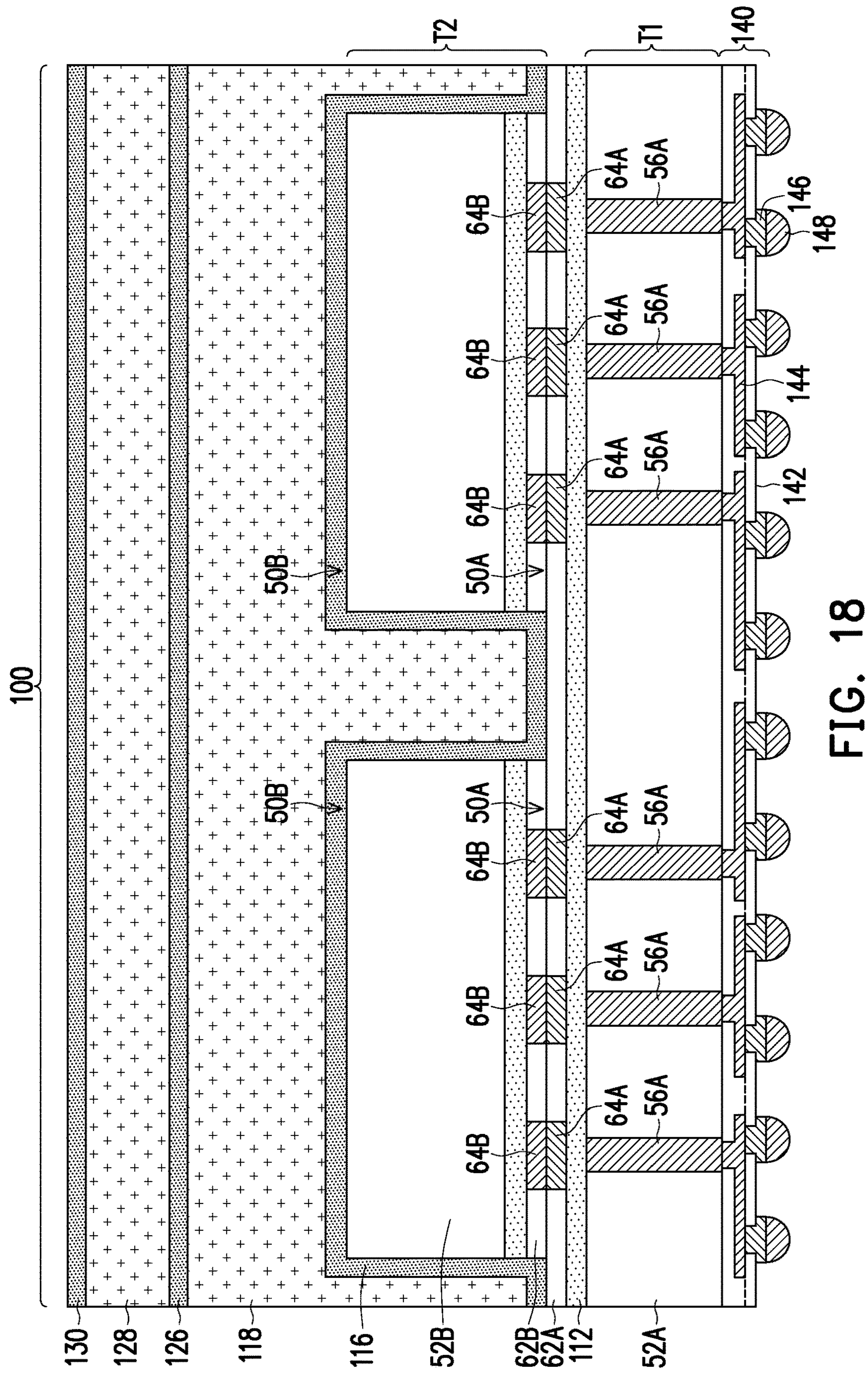
FIG. 18 is a cross-sectional view of a die structure, in accordance with some other embodiments.

FIG. 18 is a cross-sectional view of a die structure 100, in accordance with some other embodiments. This embodiment is similar to the embodiment of FIG. 15, except the die structure 100 only includes one first integrated circuit die 50A, and the first integrated circuit die 50A is laterally coterminous with the gap-fill dielectric 118. Additionally, the gap-fill dielectric 108 and the buffer layer 106 are omitted. Further, the front-sides of the second integrated circuit dies 50B face the front-side of the first integrated circuit die 50A. The redistribution structure 140 is formed on the inactive surface of the first integrated circuit die 50A. The second integrated circuit dies 50B may be bonded to the first integrated circuit die 50A by hybrid bonding, in a similar manner as previously described for FIG. 17.

The previously described die structures 100 are components that may be subsequently implemented in an integrated circuit package. The integrated circuit dies 50 of a die structure 100 may be heterogeneous dies. Packaging the die structure 100 in lieu of or in addition to packaging integrated circuit dies individually may allow heterogeneous dies to be integrated with a small footprint. In some embodiments (as subsequently described for FIG. 19), an integrated circuit package is formed by attaching a die structure 100 to a routing structure. In some embodiments (as subsequently described for FIG. 20), an integrated circuit package is formed by encapsulating the die structure 100 and forming redistribution lines on the encapsulant to fan-out connections from the die structure 100.

Figure 19:
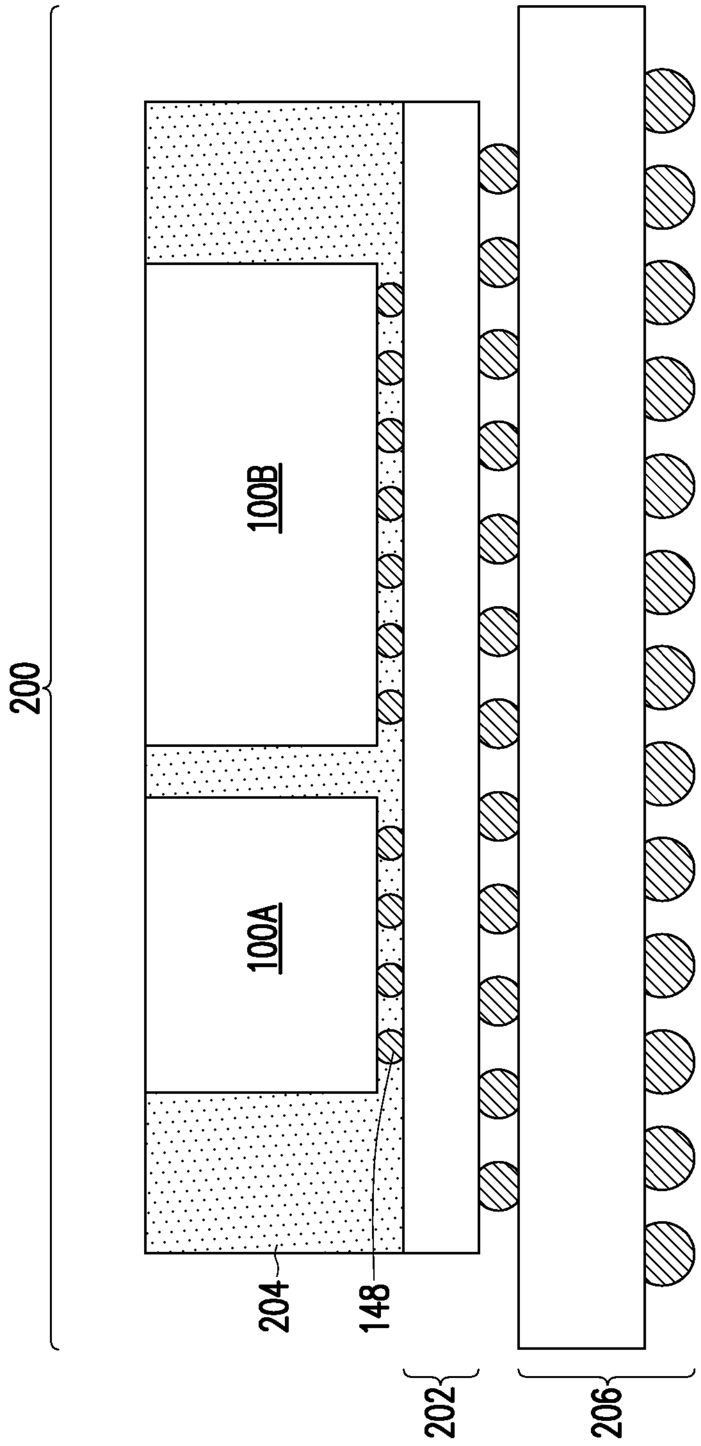
FIG. 19 is a cross-sectional view of an integrated circuit package, in accordance with some embodiments.

FIG. 19 is a cross-sectional view of an integrated circuit package 200, in accordance with some embodiments. The integrated circuit package 200 includes die structures 100 (including a first die structure 100A and a second die structure 100B) attached to a routing structure 202. In this integrated circuit package 200, the die structures 100 include the conductive connectors 148. The first die structure 100A may be different than the second die structure 100B. For example, the first die structure 100A may be a memory device while the second die structure 100B may be a logic device. The routing structure 202 may be an interposer, a redistribution structure, or the like. In the illustrated embodiment, the die structures 100 are attached to the routing structure 202 with the conductive connectors 148. The conductive connectors 148 may be reflowed to attach UBMs of the die structures 100 to die connectors of the routing structure 202. An underfill (not separately illustrated) may be formed around the conductive connectors 148, and between the routing structure 202 and the die structures 100. After the die structures 100 are attached to the routing structure 202, an encapsulant 204 is formed on and around the various components. The encapsulant 204 encapsulates the die structures 100. Subsequently, the routing structure 202 may be attached to a package substrate 206.

Figure 20:
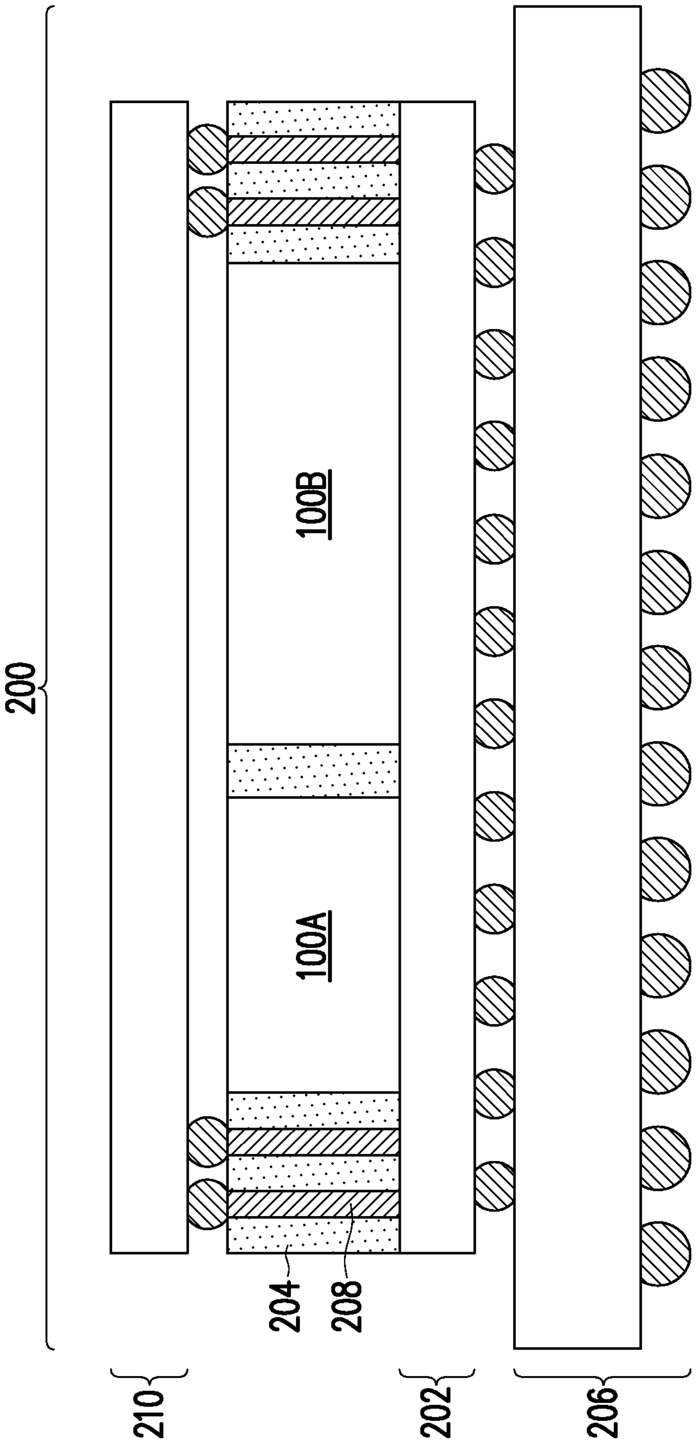
FIG. 20 is a cross-sectional view of an integrated circuit package, in accordance with some embodiments.

FIG. 20 is a cross-sectional view of an integrated circuit package 200, in accordance with some embodiments. The integrated circuit package 200 includes die structures 100 (including a first die structure 100A and a second die structure 100B) encapsulated in an encapsulant 204. In this integrated circuit package 200, the conductive connectors 148 are omitted from the die structures 100. The first die structure 100A may be different than the second die structure 100B. For example, the first die structure 100A may be a memory device while the second die structure 100B may be a logic device. After the die structures 100 are encapsulated in the encapsulant 204, a routing structure 202 is formed on the die structures 100 and/or the encapsulant 204. The routing structure 202 may be a redistribution structure that includes redistribution lines, built up on the die structures 100 and/or the encapsulant 204. The redistribution lines of the routing structure 202 are connected to the die structures 100 and fan-out electrical connections from the die structures 100. Subsequently, the routing structure 202 may be attached to a package substrate 206.

Optionally, the integrated circuit package 200 may further include through vias 208 adjacent the die structures 100. The through vias 208 extend through the encapsulant 204. The redistribution lines of the routing structure 202 are connected to the through vias 208. Further, the integrated circuit package 200 may include a stacked integrated circuit device 210. The stacked integrated circuit device 210 may be a die structure, an individual die, or the like. The stacked integrated circuit device 210 may be connected to the through vias 208, and thus to the routing structure 202.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Embodiments may achieve advantages. Forming the buffer layers 106, 116, 126 of a material having a columnar crystalline structure may help them have a large thermal conductivity. The thermal pathway for conducting heat from the integrated circuit dies 50 may thus be improved. Further, the protection layer 130, having a greater hardness than the integrated circuit dies 50, may offer good protection to the integrated circuit dies 50. As a result, the reliability of the die structures 100 may be improved. Further, including the heat dissipation layer 128 in the die structures 100 may help reduce warpage of the die structures 100. Reducing the warpage of the die structures 100 may improve the yield and/or performance of an integrated circuit package in which the die structures 100 are subsequently packaged.

In an embodiment, a device includes: a lower integrated circuit die; an upper integrated circuit die bonded to the lower integrated circuit die with a dielectric-to-dielectric bonding region and with a metal-to-metal bonding region; a first buffer layer around the upper integrated circuit die, the first buffer layer including a buffer material having a first thermal conductivity, the buffer material having a columnar crystalline structure, the columnar crystalline structure including crystalline columns having a substantially uniform orientation in a direction that extends away from the lower integrated circuit die; and a gap-fill dielectric over the first buffer layer and around the upper integrated circuit die, the gap-fill dielectric having a second thermal conductivity, the first thermal conductivity greater than the second thermal conductivity. In some embodiments, the device further includes: a support substrate over the gap-fill dielectric and the upper integrated circuit die, the upper integrated circuit die exerting a compressive strain on the support substrate; and a heat dissipation layer over the support substrate, the heat dissipation layer exerting a compressive strain on the support substrate, the heat dissipation layer including a heat dissipation material having a third thermal conductivity, the third thermal conductivity greater than the first thermal conductivity, the heat dissipation material having a non-columnar crystalline structure, the non-columnar crystalline structure including crystalline grains having a varied orientation. In some embodiments, the device further includes: a second buffer layer over the gap-fill dielectric, the second buffer layer including the buffer material; and a heat dissipation layer over the second buffer layer, the heat dissipation layer including a heat dissipation material having a third thermal conductivity, the third thermal conductivity greater than the first thermal conductivity, the heat dissipation material having a non-columnar crystalline structure, the non-columnar crystalline structure including crystalline grains having a varied orientation. In some embodiments of the device, the gap-fill dielectric has a non-columnar crystalline structure, the non-columnar crystalline structure including crystalline grains having a varied orientation. In some embodiments of the device, the gap-fill dielectric is aluminum nitride and the buffer material is aluminum nitride. In some embodiments of the device, a top surface of the gap-fill dielectric is coplanar with a top surface of the upper integrated circuit die. In some embodiments of the device, a top surface of the gap-fill dielectric is disposed over a top surface of the upper integrated circuit die.

In an embodiment, a device includes: a lower integrated circuit die; an upper integrated circuit die bonded to the lower integrated circuit die with a dielectric-to-dielectric bonding region and with a metal-to-metal bonding region; a buffer layer around the upper integrated circuit die, the buffer layer including a buffer material having a first thermal conductivity; a gap-fill dielectric over the buffer layer and around the upper integrated circuit die, the gap-fill dielectric having a second thermal conductivity, the first thermal conductivity greater than the second thermal conductivity; a support substrate over the gap-fill dielectric and the upper integrated circuit die; and a heat dissipation layer over the support substrate, the heat dissipation layer including a heat dissipation material having a third thermal conductivity, the third thermal conductivity being greater than the first thermal conductivity. In some embodiments of the device, the heat dissipation layer exerts a compressive strain against a first side of the support substrate, and the upper integrated circuit die exerts a compressive strain against a second side of the support substrate, the second side opposite the first side. In some embodiments, the device further includes: a protection layer over the heat dissipation layer, the protection layer including a protection material having a first hardness, the upper integrated circuit die having a second hardness, the first hardness greater than the second hardness. In some embodiments of the device, the buffer material has a columnar crystalline structure, the gap-fill dielectric has a non-columnar crystalline structure, and the heat dissipation material has a non-columnar crystalline structure. In some embodiments of the device, the heat dissipation material is a porous dielectric material. In some embodiments of the device, the heat dissipation material is a semiconductor material.

In an embodiment, a method includes: forming a die structure by: bonding an upper integrated circuit die to a lower integrated circuit die with a dielectric-to-dielectric bonding region and with a metal-to-metal bonding region; depositing a buffer material over the upper integrated circuit die and the lower integrated circuit die with a sputtering process, the buffer material having a first thermal conductivity and a first crystalline structure; and depositing a gap-fill dielectric over the buffer material with a chemical deposition process, the gap-fill dielectric having a second thermal conductivity and a second crystalline structure, the first thermal conductivity greater than the second thermal conductivity, the first crystalline structure different than the second crystalline structure. In some embodiments of the method, the buffer material and the gap-fill dielectric include the same dielectric material. In some embodiments of the method, the first crystalline structure is a columnar crystalline structure and the second crystalline structure is a non-columnar crystalline structure. In some embodiments of the method, forming the die structure further includes: bonding a support substrate to the gap-fill dielectric and the upper integrated circuit die; and depositing a heat dissipation material over the support substrate with a chemical deposition process, the heat dissipation material having a third thermal conductivity and a third crystalline structure, the third thermal conductivity greater than the first thermal conductivity, the third crystalline structure different than the first crystalline structure. In some embodiments of the method, forming the die structure further includes: depositing a heat dissipation material over the gap-fill dielectric with a chemical deposition process, the heat dissipation material having a third thermal conductivity and a third crystalline structure, the third thermal conductivity greater than the first thermal conductivity, the third crystalline structure different than the first crystalline structure. In some embodiments, the method further includes: attaching the die structure to a routing structure; and encapsulating the die structure in an encapsulant. In some embodiments, the method further includes: encapsulating the die structure in an encapsulant; and forming a routing structure over the encapsulant.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:

forming a die structure by:

bonding an upper integrated circuit die to a lower integrated circuit die with a dielectric-to-dielectric bonding region and with a metal-to-metal bonding region;

depositing a buffer material over the upper integrated circuit die and the lower integrated circuit die with a sputtering process, the buffer material having a first thermal conductivity and a first crystalline structure; and depositing a gap-fill dielectric over the buffer material with a chemical deposition process, the gap-fill dielectric having a second thermal conductivity and a second crystalline structure, the first thermal conductivity greater than the second thermal conductivity, the first crystalline structure different than the second crystalline structure.

2. The method of claim 1, wherein the buffer material and the gap-fill dielectric comprise the same dielectric material.

3. The method of claim 1, wherein the first crystalline structure is a columnar crystalline structure and the second crystalline structure is a non-columnar crystalline structure.

4. The method of claim 1, wherein forming the die structure further comprises:

bonding a support substrate to the gap-fill dielectric and the upper integrated circuit die; and depositing a heat dissipation material over the support substrate with a chemical deposition process, the heat dissipation material having a third thermal conductivity and a third crystalline structure, the third thermal conductivity greater than the first thermal conductivity, the third crystalline structure different than the first crystalline structure.

5. The method of claim 1, wherein forming the die structure further comprises:

depositing a heat dissipation material over the gap-fill dielectric with a chemical deposition process, the heat dissipation material having a third thermal conductivity and a third crystalline structure, the third thermal conductivity greater than the first thermal conductivity, the third crystalline structure different than the first crystalline structure.

6. The method of claim 1, further comprising:

attaching the die structure to a routing structure; and encapsulating the die structure in an encapsulant.

7. The method of claim 1, further comprising:

encapsulating the die structure in an encapsulant; and forming a routing structure over the encapsulant.

8. A method comprising:

forming a die structure by:

attaching a plurality of first integrated circuit dies to a carrier substrate;

depositing a buffer layer in a gap between the first integrated circuit dies, the buffer layer comprising a buffer material having a first thermal conductivity, the buffer material having a columnar crystalline structure, the columnar crystalline structure comprising crystalline columns having a substantially uniform orientation in a direction that extends away from the carrier substrate;

depositing a gap-fill dielectric over the buffer layer and in the gap between the first integrated circuit dies, the gap-fill dielectric having a second thermal conductivity, the first thermal conductivity greater than the second thermal conductivity;

removing the carrier substrate to expose front sides of the first integrated circuit dies; and forming a redistribution structure on the exposed front sides of the first integrated circuit dies; and packaging the die structure.

9. The method of claim 8, wherein the gap-fill dielectric has a non-columnar crystalline structure, the non-columnar crystalline structure comprising crystalline grains having a varied orientation.

10. The method of claim 9, wherein the buffer material is deposited with a first deposition process that forms the columnar crystalline structure, the gap-fill dielectric is deposited with a second deposition process that forms the non-columnar crystalline structure, and the first deposition process is a different type of process than the second deposition process.

11. The method of claim 9, wherein the gap-fill dielectric is aluminum nitride and the buffer material is aluminum nitride.

12. The method of claim 8, wherein forming the die structure further comprises:

planarizing top surfaces of the gap-fill dielectric and the buffer layer with back sides of the first integrated circuit dies;

thinning the first integrated circuit dies to expose conductive vias at the back sides of the first integrated circuit dies;

forming a bonding layer over the back sides of the first integrated circuit dies, over the buffer layer, and over the gap-fill dielectric, the bonding layer being around the conductive vias; and forming die connectors in the bonding layer, the die connectors being connected to the conductive vias.

13. The method of claim 12, wherein forming the die structure further comprises:

attaching a plurality of second integrated circuit dies to the first integrated circuit dies using the bonding layer and the die connectors.

14. The method of claim 8, wherein packaging the die structure comprises attaching the die structure to a routing structure and encapsulating the die structure in an encapsulant.

15. The method of claim 8, wherein packaging the die structure comprises encapsulating the die structure in an encapsulant and forming a routing structure over the encapsulant.

16. A method comprising:

forming a die structure by:

placing a plurality of integrated circuit dies in a device region;

depositing a buffer layer in a gap between the integrated circuit dies with a sputtering process, the buffer layer comprising a buffer material having a first thermal conductivity;

depositing a gap-fill dielectric over the buffer layer and in the gap between the integrated circuit dies with a chemical deposition process, the gap-fill dielectric having a second thermal conductivity, the first thermal conductivity greater than the second thermal conductivity;

depositing a heat dissipation layer over the gap-fill dielectric, the heat dissipation layer comprising a heat dissipation material having a third thermal conductivity, the third thermal conductivity being greater than the first thermal conductivity; and singulating the device region.

17. The method of claim 16, wherein the buffer material has a columnar crystalline structure comprising crystalline columns having a substantially uniform orientation, the gap-fill dielectric has a non-columnar crystalline structure comprising crystalline grains having a varied orientation, and the heat dissipation material has a non-columnar crystalline structure comprising crystalline grains having a varied orientation.

18. The method of claim 16, wherein the buffer material, the gap-fill dielectric, and the heat dissipation material each comprise a same dielectric material.

19. The method of claim 16, wherein forming the die structure further comprises:

planarizing surfaces of the gap-fill dielectric, the buffer layer, and the integrated circuit dies; and bonding a support substrate to the planarized surfaces, wherein the heat dissipation material is deposited over the support substrate.

20. The method of claim 16, wherein the heat dissipation material is deposited over the gap-fill dielectric while the gap-fill dielectric covers the integrated circuit dies.

* * * * *